United States Patent
Zundel et al.

(10) Patent No.: US 9,099,419 B2
(45) Date of Patent: Aug. 4, 2015

(54) TEST METHOD AND TEST ARRANGEMENT

(71) Applicant: Infineon Technologies AG, Neubiberg (DE)

(72) Inventors: Markus Zundel, Egmating (DE); Franz Hirler, Isen (DE); Peter Nelle, Munich (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 238 days.

(21) Appl. No.: 13/647,480

(22) Filed: Oct. 9, 2012

(65) Prior Publication Data

US 2014/0097863 A1 Apr. 10, 2014

(51) Int. Cl.
*G01R 31/26* (2014.01)
*H01L 21/66* (2006.01)
*G01R 31/28* (2006.01)

(52) U.S. Cl.
CPC ............ *H01L 22/34* (2013.01); *G01R 31/2884* (2013.01); *H01L 22/32* (2013.01); *H01L 2924/0002* (2013.01)

(58) Field of Classification Search
CPC ...................................................... G01R 31/28
See application file for complete search history.

(56) References Cited

U.S. PATENT DOCUMENTS

| | | | |
|---|---|---|---|
| 6,690,062 B2 | 2/2004 | Henninger et al. | |
| 6,858,895 B2 | 2/2005 | Feldtkeller et al. | |
| 6,885,062 B2 | 4/2005 | Zundel et al. | |
| 7,253,475 B2 | 8/2007 | Schaffer | |
| 7,473,603 B2 | 1/2009 | Kraft et al. | |
| 7,893,486 B2 | 2/2011 | Hirler et al. | |
| 8,030,703 B2 | 10/2011 | Kotz et al. | |
| 8,994,078 B2 | 3/2015 | Kueck et al. | |
| 2003/0178676 A1* | 9/2003 | Henninger et al. | 257/340 |
| 2005/0157571 A1* | 7/2005 | Schaffer | 365/200 |
| 2007/0138544 A1* | 6/2007 | Hirler et al. | 257/330 |
| 2009/0289690 A1 | 11/2009 | Hirler et al. | |
| 2014/0097863 A1 | 4/2014 | Zundel et al. | |

FOREIGN PATENT DOCUMENTS

| | | |
|---|---|---|
| DE | 10038177 A1 | 2/2002 |
| DE | 10207309 A1 | 9/2003 |
| DE | 10211543 A1 | 10/2003 |

(Continued)

OTHER PUBLICATIONS

For DE 100 38 177 A1 an English language abstract is provided.

(Continued)

*Primary Examiner* — Jermele M Hollington

(57) ABSTRACT

A test method in accordance with one or more embodiments may include: providing a semiconductor device to be tested, the semiconductor device including at least one device cell, the at least one device cell having at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying at least one electrical test potential to at least the at least one additional electrode to detect defects in the at least one device cell.

23 Claims, 9 Drawing Sheets

(56) References Cited

FOREIGN PATENT DOCUMENTS

| | | | |
|---|---|---|---|
| DE | 102006062011 | B4 | 12/2008 |
| DE | 112007001454 | T5 | 4/2009 |

OTHER PUBLICATIONS

Non-final Office Action of the U.S. Appl. No. 14/055,982 dated May 28, 2015.

\* cited by examiner

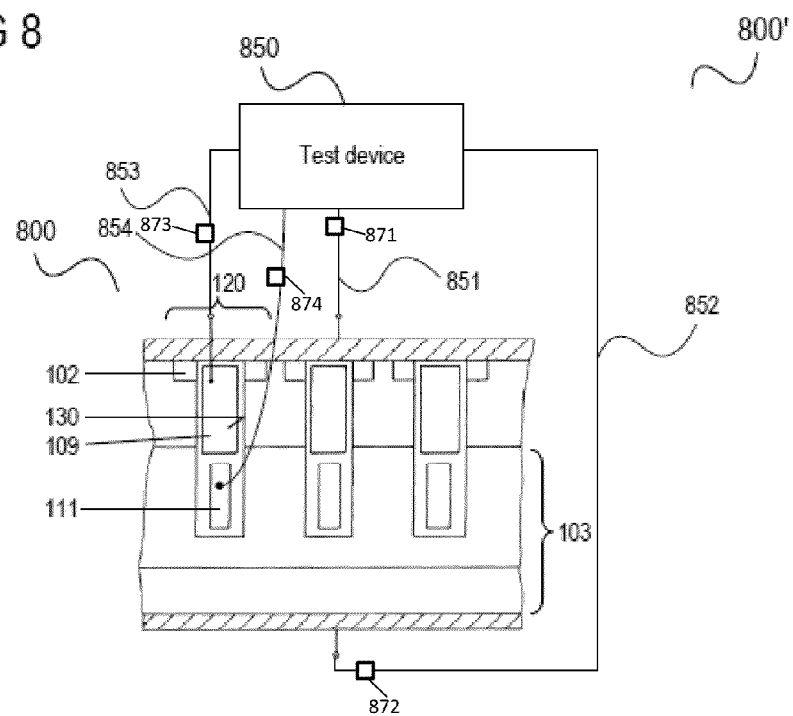
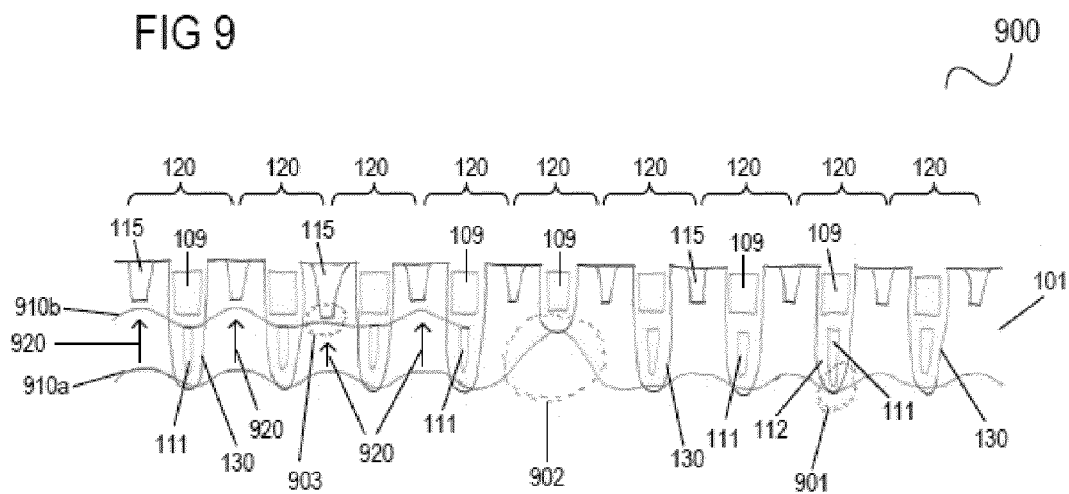

FIG 10

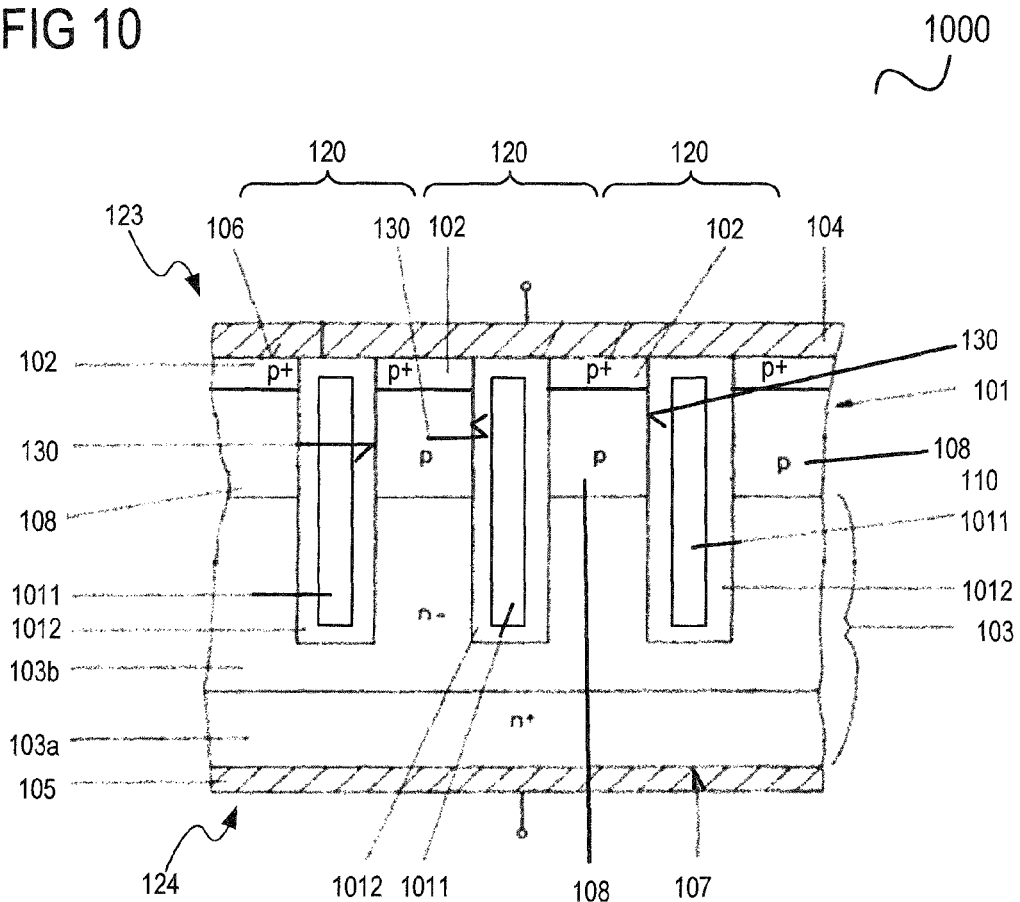

FIG 11

1102 — Providing a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region 1104 — Applying at least one electrical test potential to at least the at least one electrode to detect defects in the at least one device cell

TEST METHOD AND TEST ARRANGEMENT

TECHNICAL FIELD

Various embodiments relate to a test method and a test arrangement.

BACKGROUND

One type of semiconductor devices are trench devices such as trench transistors, e.g. trench field effect transistors (FETs) or trench insulated-gate bipolar transistors (IGBTs). Trench devices having a high or very high integration density may include a large number (e.g. thousands, tens of thousands, hundreds of thousands, or millions, or even more) of cells, sometimes also referred to as a cell field. Already one or a few defective cells in a cell field may affect a device's operating behavior and may even render a device unusable. Thus, it may be desirable to detect devices with defective cells in a pre-test of the devices (e.g. in a front end processing stage), for example in order to prevent defective devices from being delivered to customers.

SUMMARY

A test method in accordance with one or more embodiments may include: providing a semiconductor device to be tested, the semiconductor device including at least one device cell, the at least one device cell having at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying at least one electrical test potential to at least the at least one additional electrode to detect defects in the at least one device cell.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 8 shows a test arrangement according to various embodiments;

FIG. 9 shows a semiconductor device having various cell defects, and further shows an electrical scan curve, for illustrating aspects of one or more embodiments;

FIG. 10 shows a cross-sectional view of an exemplary semiconductor device for use with one or more embodiments;

FIG. 11 shows a test method according to various embodiments.

DESCRIPTION

The following detailed description refers to the accompanying drawings that show, by way of illustration, specific details and embodiments in which the invention may be practised. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The word "exemplary" is used herein to mean "serving as an example, instance, or illustration". Any embodiment or design described herein as "exemplary" is not necessarily to be construed as preferred or advantageous over other embodiments or designs.

The terms "at least one" and "one or more" may be understood to include any integer number greater than or equal to one, i.e. one, two, three, four, . . . , etc.

The term "a plurality" may be understood to include any integer number greater than or equal to two, i.e. two, three, four, five, . . . , etc.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The terms "coupling" or "connection" may be understood to include both the case of a direct "coupling" or "connection" and the case of an indirect "coupling" or "connection".

Figure 1A:
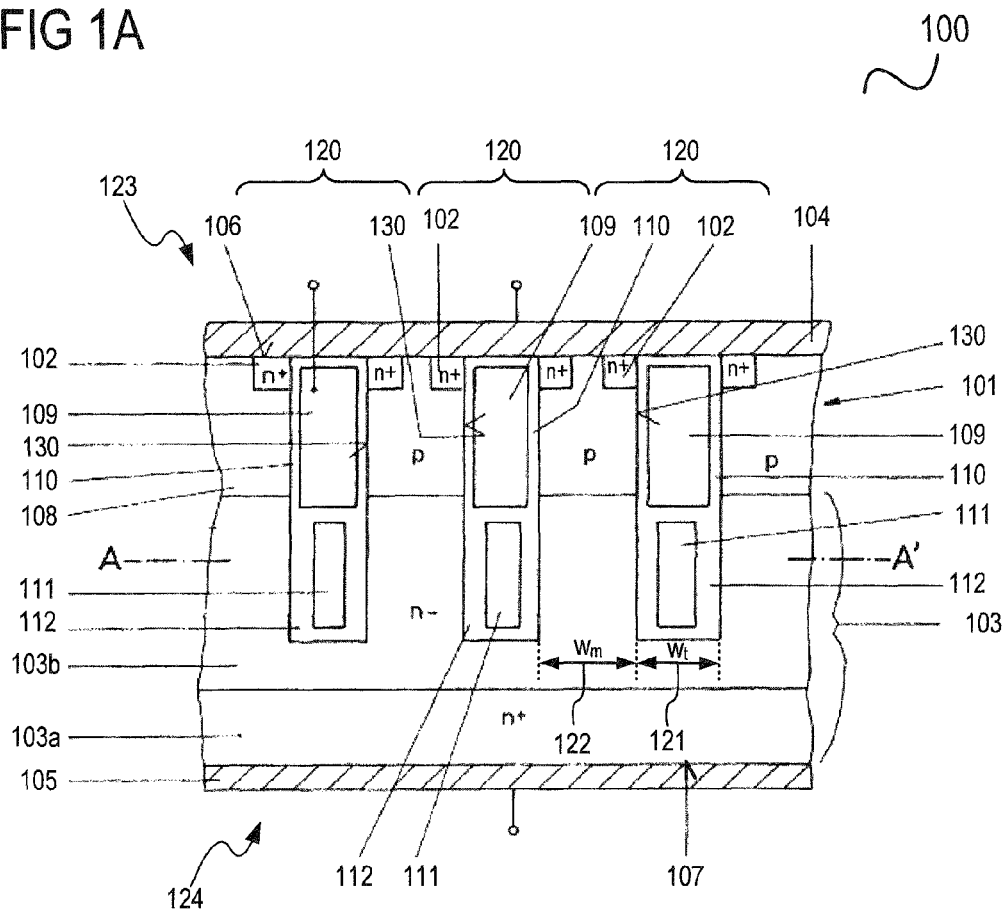
FIG. 1A shows a cross-sectional view of an exemplary semiconductor device for use with one or more embodiments.
Figure 1B:
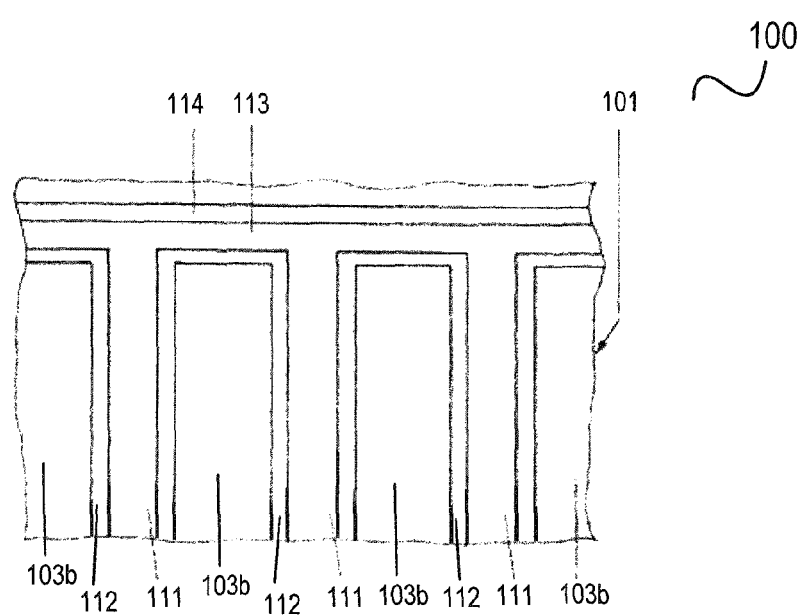
FIG. 1B shows a cross-sectional view along line A-A' in FIG. 1A.

FIG. 1A shows a cross-sectional view of an exemplary semiconductor device 100 for use with one or more embodiments, and FIG. 1B shows a cross-sectional view of the semiconductor device 100 along line A-A' in FIG. 1A.

The semiconductor device 100 may include a first side 123 and a second side 124, which may be opposite the first side 123. The first side 123 may, for example, be a front side of the semiconductor device 100 and the second side 124 may, for example, be a back side of the semiconductor device 100. Semiconductor device 100 may be configured as a trench transistor including a plurality of device cells 120 (i.e. transistor cells in this case), each device cell 120 including a trench 130. Arrow 121 indicates a trench width $w_t$ (width of trench 130), and arrow 122 indicates a distance $w_m$ between neighboring trenches 130, sometimes also referred to as mesa width. Three cells 120 are shown for purposes of illustration, however it may be understood that the number of cells 120 may be different from three, and may for example be much larger than three, e.g. on the order of thousands, tens of thousands, or millions, or even more, of cells. Semiconductor device 100 may, for example, be configured as a power transistor, for example as a power field-effect transistor. e.g. a power MOSFET.

Semiconductor device 100 may include a semiconductor body 101, in which a plurality of first terminal electrode regions 102 and a second terminal electrode region 103 may be formed. The first terminal electrode regions 102 may be source regions of the transistor, and the second terminal electrode region 103 may be a drain region of the transistor. In this case, the first terminal electrode regions 102 as a whole may also be referred to as a source zone of the transistor, and the second terminal electrode region 103 may also be referred to as a drain zone of the transistor. The first terminal electrode regions 102 may be connected to a first terminal electrode 104 and the second terminal electrode region 103 may be connected to a second terminal electrode 105. The first terminal electrode 104 may be a source electrode of the transistor, and the second terminal electrode 105 may be a drain electrode of the transistor. Alternatively, the first terminal electrode 104 may be a drain electrode of the transistor, and the second terminal electrode 105 may be a source electrode of the transistor. The first terminal electrode 104 may be formed over a first side 106 of the semiconductor body 101 and the second terminal electrode 105 may be formed over a second side 107 of the semiconductor body 101, which may be opposite the first side 106. The first side 106 may, for example, be a front side of the semiconductor body 101 and the second side 107 may, for example, be a back side of the semiconductor body 101. The first side 106 of the semiconductor body 101 may, for example, be proximate the first side 123 of the semiconductor device 100 and the second side 107 of the semiconductor body 101 may, for example, be proximate the second side 124 of the semiconductor device 100.

The first terminal electrode regions 102 and the second terminal electrode region 103 may be of the same conductivity type and may, for example, be n-doped. The second terminal electrode region 103 may include an n-doped (e.g. highly n-doped, e.g. n+ doped) first subregion 103a adjacent to the second terminal electrode 105, and an n-doped (e.g. lightly n-doped, e.g. n− doped) second subregion 103b adjacent to a side of the first subregion 103a that faces away from the second terminal electrode 105. The first subregion 103a may have a higher dopant concentration than the second subregion 103b. P-doped body regions 108 may be formed between the first terminal electrode regions 102 and the second subregion 103b of the second terminal electrode region 103. Conductive channels may form in the body regions 108 during an on-state of the semiconductor device (transistor) 100.

The first terminal electrode regions 102, the body regions 108 and the second terminal electrode region 103 may be disposed one over the other in vertical direction of the semiconductor body 101.

A plurality of first terminal electrode regions 102 may be provided in the semiconductor body 101, wherein a gate electrode 109 may in each case extend from each of the first terminal electrode regions 102 through the body regions 108 into the second subregion 103b of the second terminal electrode region 103. The first terminal electrode regions 102 may be connected to a common first electrode 104. The gate electrodes 109 may be insulated from the semiconductor body 101 by a first insulating layer 110. The gate electrodes 109 may be connectable or connected to a common potential (e.g. gate driving potential).

An additional electrode 111 may in each case be assigned to each of the gate electrodes 109. The additional electrodes 111 may be located entirely within the second subregion 103b of the second terminal electrode region 103, with each of the additional electrodes 111 being surrounded by a respective second insulating layer 112 and located adjacent to a corresponding gate electrode 109. A gate electrode 109 and an additional electrode 111 may in each case be disposed one over the other in a vertical direction of the semiconductor body 101 in a common trench 130, which may extend in the vertical direction of the semiconductor body 101 from the first side 106 as far as into the second terminal electrode region 103. The gate electrodes 109 and additional electrodes 111 located in a common trench 130 may be insulated from one another by their respective first and second insulating layers 110, 112.

The additional electrodes 111 may be electrically connected together to apply a common electrical potential to all of the additional electrodes 111.

As shown in FIG. 1B, the additional electrodes 111 may be configured as plates. A common plate 113 may be provided to apply a common electrical potential. The common plate 113 may connect the additional electrodes 111 with one another and may be insulated from the semiconductor body 101 by an electrically insulating layer 114. The electrical connection of the additional electrodes 111 with one another may be achieved in the trench (as shown) or may be achieved at the surface of semiconductor device 100. The gate electrodes 109 may be configured as plates and may be connected to a common electrical potential via a common plate in a similar manner as the additional electrodes 111. The electrical connection of the gate electrodes 109 with one another may be achieved in the trench or may be achieved at the surface of semiconductor device 100. It may be provided that there is no electrically conductive connection between the gate electrodes 109 and the additional electrodes 111. In other words, the gate electrodes 109 and additional electrodes 111 may be electrically separated or disconnected from each other.

Each of the gate electrodes 109 and the additional electrodes 111 and each of the first terminal electrode regions 102 may be part of a respective cell 120 of semiconductor device 100. For example in order to be able to switch high currents, it may be desirable to provide a large number of uniformly configured cells 120.

As all cells 120 of semiconductor device 100 may be connected to the same electrical potentials (e.g. supply potentials and drive potentials), all cells 120 may be driven in the same manner. In other words, the first terminal electrode regions 102 of all cells 120 may be all connected to the same electrical potential, the gate electrodes 109 of all cells 120 may be all connected to the same electrical potential, and the additional electrodes 111 of all cells 120 may be all connected to the same electrical potential. Furthermore, a common second terminal electrode region 103 may be provided for all cells 120 according to this example.

The gate electrodes 109 may serve to control the switching state of the semiconductor device (transistor) 100. The additional electrodes 111 may serve to "shield" the gate electrodes 109 when a supply voltage is applied between the first and second terminal electrodes 104, 105 (or, between the first terminal electrode regions 102 and the second terminal electrode region 103), i.e. the additional electrodes 111 may serve to reduce the strength of an electric field acting on the first insulating layer 110 of the gate electrodes 109. Thus, the additional electrodes 111 may also be referred to as "shield electrodes". For example in case that the additional electrodes 111 are configured as plates, they may sometimes also be referred to as field plates.

Due to the aforementioned shielding effect, the first insulating layer 110 may, for example, be configured with a smaller thickness while obtaining the same electric strength as in similar devices without additional (shield) electrodes 111. The reduced insulating layer thickness may, for example, reduce the on-state resistance of the semiconductor device 100 and/or parasitic capacitances between the gate electrodes 109 and the second terminal electrode region 103, which may lead to reduced switching losses. Furthermore, as in the semiconductor device 100 a voltage drop between the first terminal electrode 104 and the second terminal electrode 105 may occur primarily in the region of the additional electrodes 111, it may be possible to increase the doping of the second terminal electrode region 103 compared to devices having no additional (shield) electrodes 111, without adding stress in form of a higher field strength onto the gate electrodes 109.

As mentioned above, the first terminal electrode regions 102 may be source regions and the first terminal electrode 104 may be a source electrode, which may be at the first side 123 of the transistor 100, and the second terminal electrode region 103 may be a drain region and the second terminal electrode 105 may be a drain electrode, which may be at the second side 124 of the transistor 100. Alternatively, the transistor 100 may be implemented in a so-called source down configuration. In this case the situation in FIG. 1A may illustratively be flipped so that the source regions 102 may be at the second side 124 and the drain region 103 may be at the first side 123 of the transistor 100. In this configuration, the first terminal electrode 104 may be a drain electrode, the second terminal electrode 105 may be a source electrode, and the electrodes 109, 111 in the trenches 130 may be connected to pads at the first side 123 of the transistor 100. Alternatively, electrode 109 may be connected to a pad at the first side 123 of the transistor 100 and electrode 111 may be connected to a pad at the second side 124 of the transistor 100. Similar considerations may apply for other semiconductor devices, e.g. transistors, described herein below.

Figure 1C:
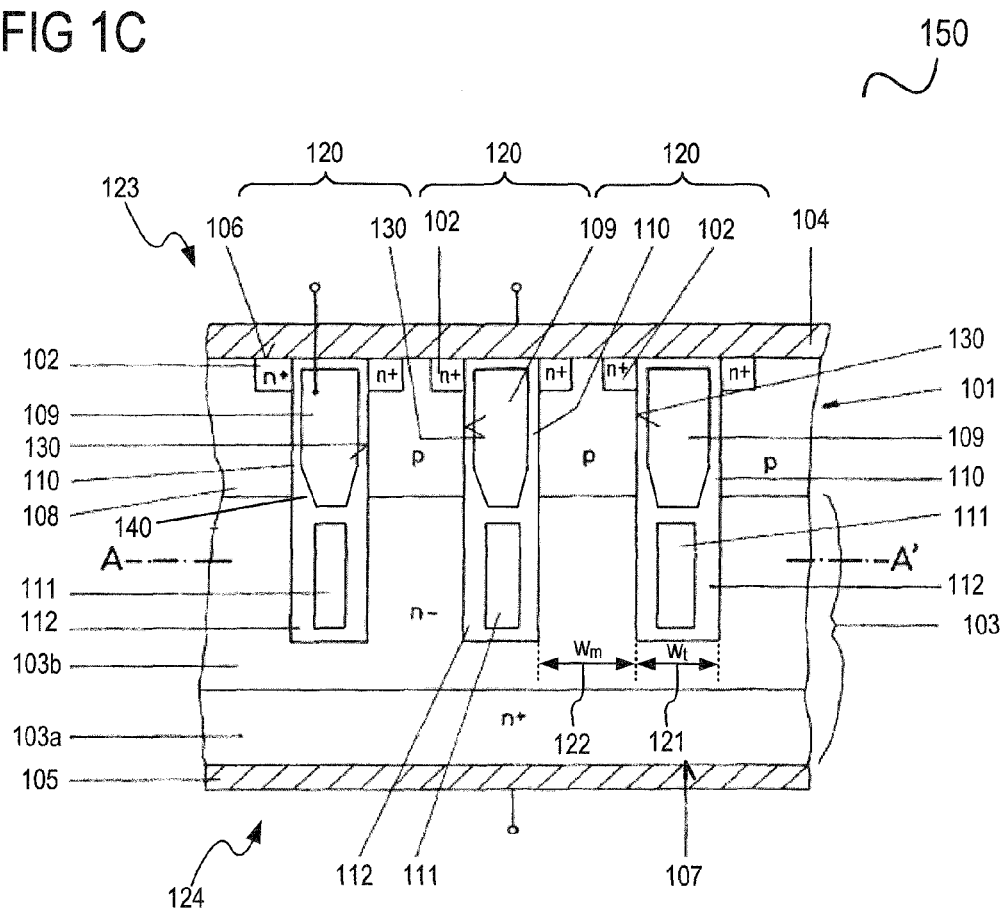
FIG. 1C shows a cross-sectional view of a further exemplary semiconductor device for use with one or more embodiments.

FIG. 1C shows a cross-sectional view of a further exemplary semiconductor device 150 for use with one or more embodiments. A cross-sectional view along line A-A' in FIG. 1C may be similar as shown in FIG. 1B.

Semiconductor device 150 may be configured as a trench transistor and may be to some degree similar to semiconductor device 100 described above. In particular, reference numerals which are the same as there may denote the same or similar elements, which will thus not be described in detail again here. Reference is made to the description above.

Semiconductor device 150 differs from semiconductor device 100 in that the first insulating layer 110 may have a graded thickness in a region 140 proximate the lower end of the gate electrode 109. As shown, the thickness of the first insulating layer 110 may increase in the region 140 and may, for example, approach the thickness of the second insulating layer 112. This increase in the thickness may sometimes also be referred to as dielectric layer ramp (or oxide ramp in case of an oxide as insulating material).

Figure 2:
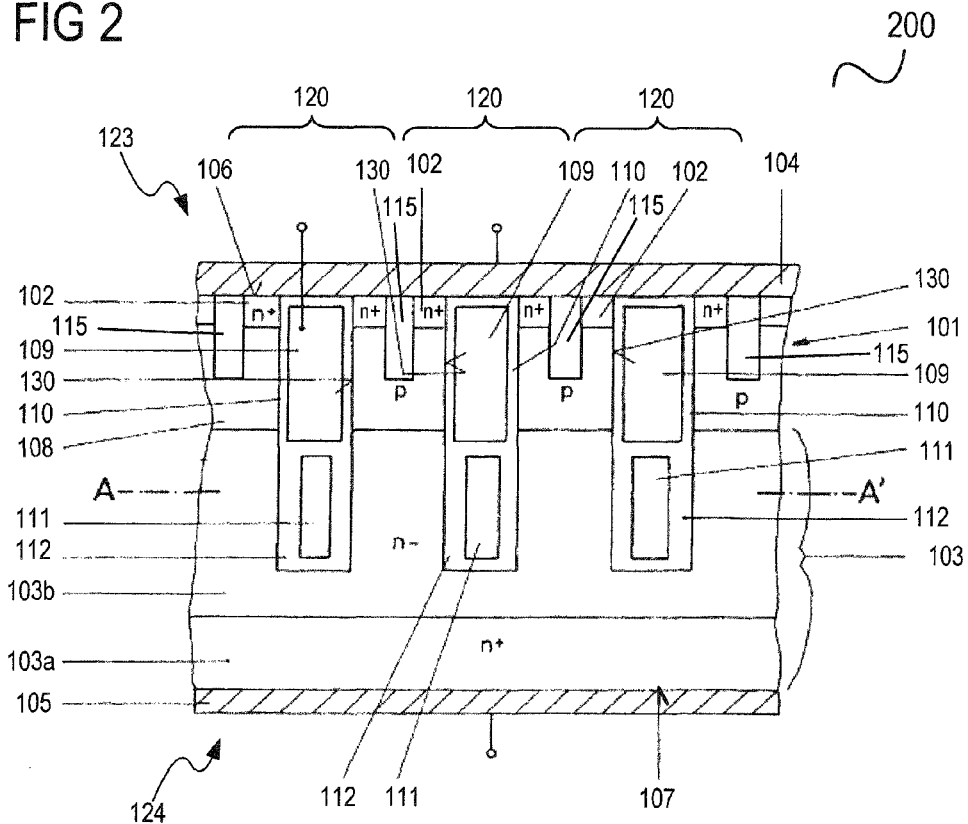
FIGS. 2 to 5 show cross-sectional views of further exemplary semiconductor devices for use with one or more embodiments.

FIG. 2 shows a cross-sectional view of a further exemplary semiconductor device 200 for use with one or more embodiments. A cross-sectional view along line A-A' in FIG. 2 may be similar as shown in FIG. 1B.

Semiconductor device 200 may be configured as a trench transistor and may be to some degree similar to semiconductor devices 100 and 150 described above. In particular, reference numerals which are the same as there may denote the same or similar elements, which will thus not be described in detail again here. Reference is made to the description above.

Semiconductor device 200 may include one or more contact trenches 115 that may reach from the first side 106 of the semiconductor body 101 into the semiconductor body 101. The contact trenches 115 may end in the respective body regions 108. The contact trenches 115 may be disposed between the trenches 130. For example, a contact trench 115 may in each case be disposed between the trenches 130 of two neighboring device cells 120. The contact trench 115 may allow for electrically contacting a respective body region 108, for example by means of a highly doped region at the bottom of the contact trench 115. Furthermore, the contact trench 115 may also allow for electrically contacting the first terminal electrode regions 102, for example by means of highly doped regions at an upper part of the contact trench 115.

Contacting also the first terminal electrode regions 102 via the contact trench 115 may, for example, be applied in cases where an integration density may be so high that there may be not enough space to contact the first terminal electrode regions 102 from the surface.

Figure 3:
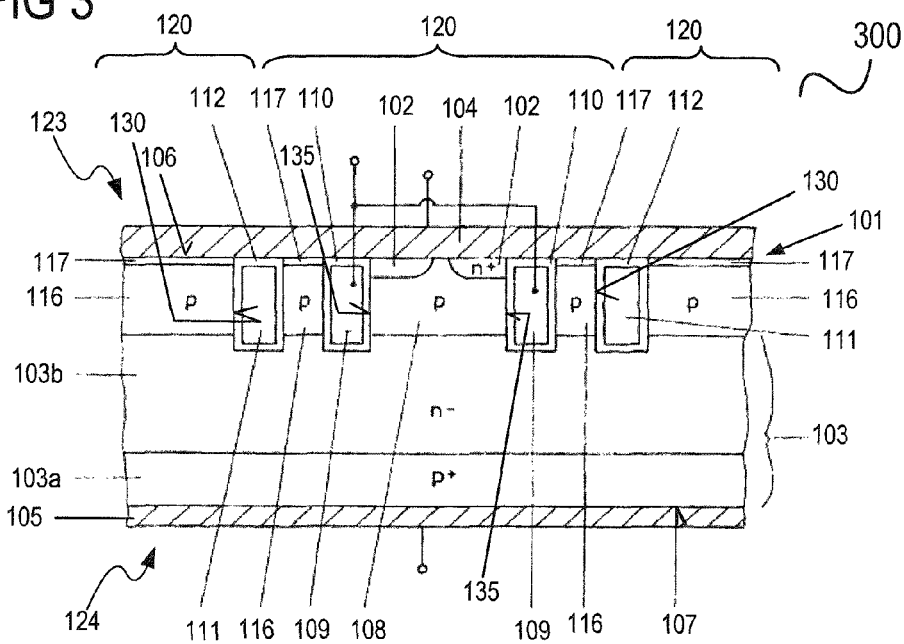

FIG. 3 shows a cross-sectional view of a further exemplary semiconductor device 300 for use with one or more embodiments.

Semiconductor device 300 may be configured as a trench transistor including a plurality of transistor cells 120 and may be to some degree similar to semiconductor devices 100, 150 and 200 described above. In particular, reference numerals which are the same as there may denote the same or similar elements, which will thus not be described in detail again here. Reference is made to the description above.

A transistor cell 120 in semiconductor device 300 may include two first trenches 130 and two second trenches 135 disposed next to each other in lateral direction of the semiconductor body 101. An additional electrode 111 may be disposed in each of the first trenches 130, and a gate electrode 109 may be disposed in each of the second trenches 135. The gate electrodes 109 may be surrounded by respective first insulating layers 110, and the additional electrodes 111 may be surrounded by respective second insulating layers 112. The first insulating layer 110 may have the same thickness as the second insulating layer 112. Alternatively, the first insulating layer 110 and the second insulating layer 112 may have different thicknesses. For example, the first insulating layer 110 may be thinner than the second insulating layer 112. The gate electrodes 109 may be disposed adjacent to first terminal electrode regions 102. The first terminal electrode regions 102 may be connected to a first terminal electrode 104, which may be disposed over a first side 106 of the semiconductor body 101. A second terminal electrode 105 may be disposed over a second side 107 of the semiconductor body 101, which may be opposite the first side 106. The first side 106 may, for example, be a front side of the semiconductor body 101 and the second side 107 may, for example, be a back side of the semiconductor body 101. The second terminal electrode 105 may serve to contact a second terminal electrode region 103, which may include a p-doped (e.g. highly p-doped, e.g. p+ doped) first subregion 103a adjacent to the second terminal electrode 105 and an n-doped (e.g. lightly n-doped, e.g. n− doped) second subregion 103b adjacent to the first subregion 103a. A p-doped body region 108 may be formed between the second terminal electrode region 103 (or the second subregion 103b of the second terminal electrode region 103) and the first terminal electrode regions 102. The gate electrodes 109 may extend along the body region 108 as far as into the second terminal electrode region 103, starting from the first side 106 of the semiconductor body 101. Additional p-doped regions 116 may be formed between the gate electrodes 109 and the additional electrodes 111 above the second terminal electrode region 103 and below the first terminal electrode 104. The additional p-doped regions 116 may be insulated from the first terminal electrode 104 by means of respective insulating layers 117.

Semiconductor device 300 may operate as an insulated-gate bipolar transistor (IGBT), due to the complementary doping of the first and second subregions 103a, 103b of the second terminal electrode region 103.

Similarly as in semiconductor devices 100, 150, and 200, the additional electrodes 111 may shield the gate electrodes 109 and may prevent large field strengths at the first insulating layers 110.

Figure 4:
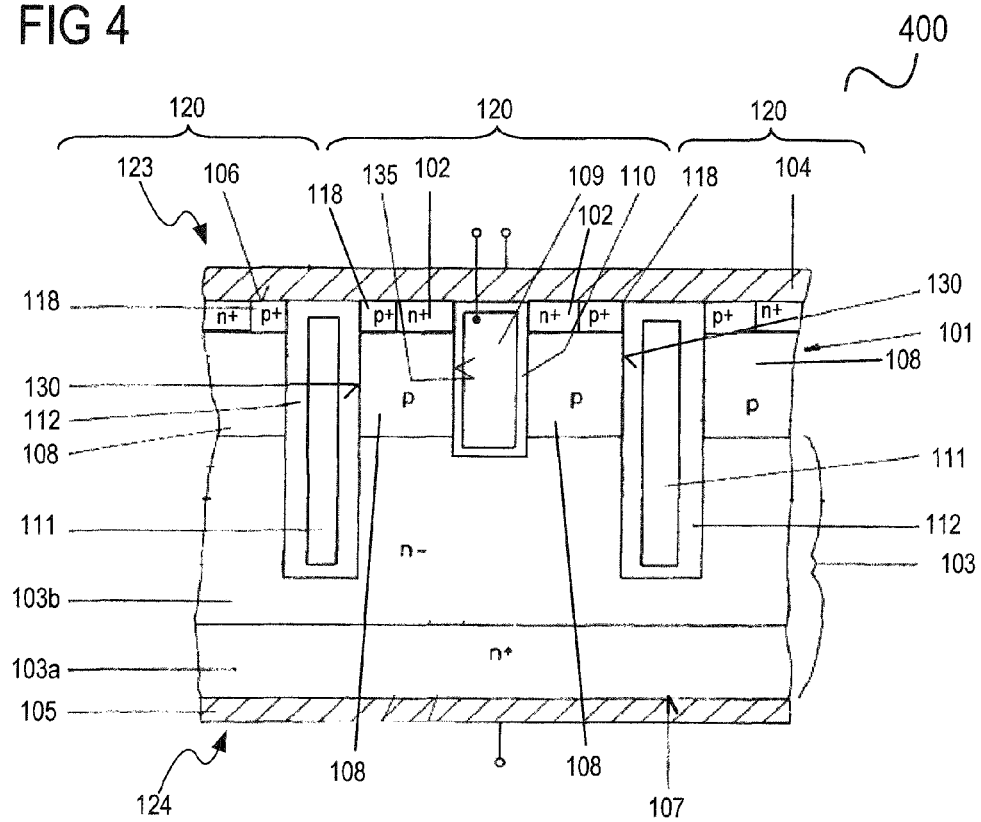

FIG. 4 shows a cross-sectional view of a further exemplary semiconductor device 400 for use with one or more embodiments.

Semiconductor device 400 may be configured as a trench transistor including a plurality of transistor cells 120 and may be to some degree similar to semiconductor devices 100, 150, 200 and 300 described above. In particular, reference numerals which are the same as there may denote the same or similar elements, which will thus not be described in detail again here. Reference is made to the description above.

A transistor cell 120 in semiconductor device 400 may include two first trenches 130 and a second trench 135 disposed next to each other in lateral direction of the semiconductor body 101. Additional electrodes 111 may be disposed in the first trenches 130, and a gate electrode 109 may be disposed in the second trench 135 of the cell 120. The second trench 135 may be disposed laterally between the two first trenches 130. Each first trench 130 may be shared by two adjacent cells 120, as shown in FIG. 4, which shows three cells 120, i.e. a center cell 120 and two neighboring cells 120 (only parts of the neighboring cells are shown). The gate electrode 109 may be surrounded by a first insulating layer 110, and the additional electrodes 111 may be surrounded by respective second insulating layers 112. The gate electrode 109 may be disposed adjacent to first terminal electrode regions 102. The first terminal electrode regions 102 may be connected to a first terminal electrode 104, which may be disposed over a first side 106 of the semiconductor body 101. A second terminal electrode 105 may be disposed over a second side 107 of the semiconductor body 101, which may be opposite the first side 106. The first side 106 may, for example, be a front side of the semiconductor body 101 and the second side 107 may, for example, be a back side of the semiconductor body 101. The second terminal electrode 105 may serve to contact a second terminal electrode region 103, which may include an n-doped (e.g. highly n-doped, e.g. n+ doped) first subregion 103a adjacent to the second terminal electrode 105 and an n-doped (e.g. lightly n-doped, e.g. n− doped) second subregion 103b adjacent to the first subregion 103a. P-doped body regions 108 may be formed between the second terminal electrode region 103 (or the second subregion 103b of the second terminal electrode region 103) and the first terminal electrode regions 102. The gate electrode 109 may extend along the body regions 108 as far as into the second terminal electrode region 103, starting from the first side 106 of the semiconductor body 101. The additional electrodes 111 may extend along the body regions 108 and along at least part of the second terminal electrode region 103 (e.g., at least part of the second subregion 103b of the second terminal electrode region 103, as shown). Thus, the additional electrodes 111 may extend deeper into the semiconductor body 101 than the gate electrode 109. P-doped (e.g. highly p-doped, e.g. p+ doped) regions 118 may be formed adjacent to the first terminal electrode regions 102 in the p-doped body regions 108 and may be connected to the first terminal electrode 104. The p-doped regions 118 may serve to electrically contact the body regions 108.

Similarly as in semiconductor devices 100, 150, 200, and 300, the additional electrodes 111 may shield the gate electrode 109 and may prevent large field strengths at the first insulating layer 110.

Figure 5:
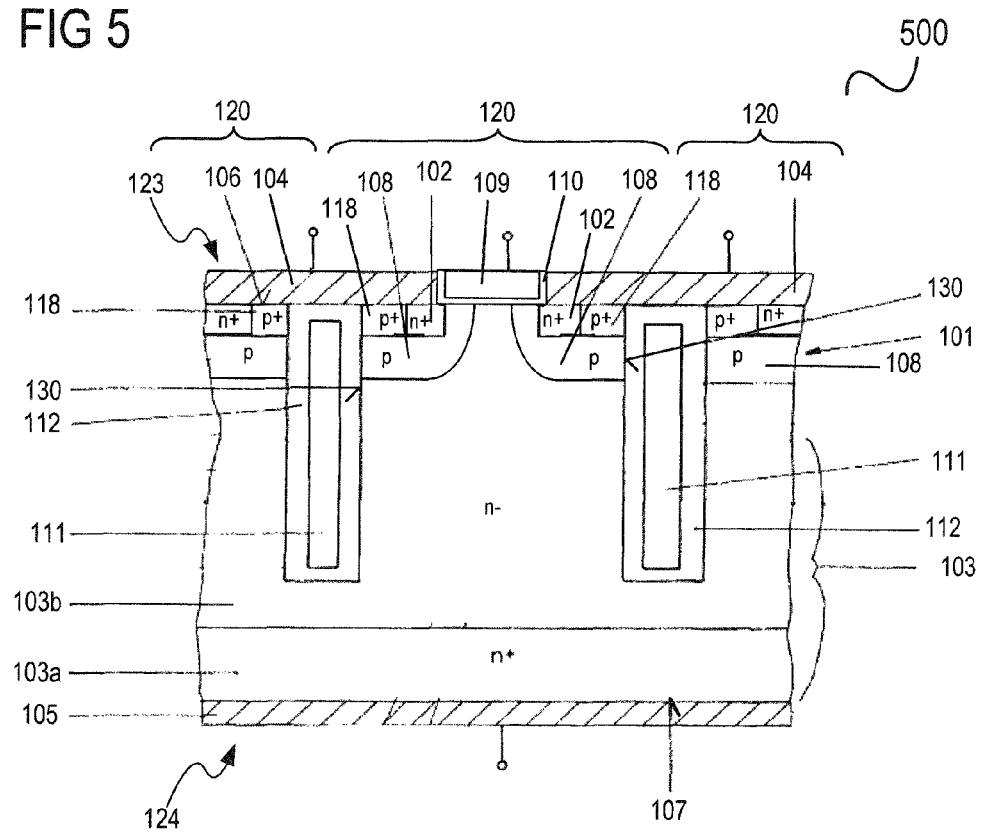

FIG. 5 shows a cross-sectional view of a further exemplary semiconductor device 500 for use with one or more embodiments.

Semiconductor device 500 is configured as a trench transistor including a plurality of transistor cells 120 and is to some degree similar to semiconductor devices 100, 150, 200, 300 and 400 described above. In particular, reference numerals which are the same as there may denote the same or similar elements, which will thus not be described in detail again here. Reference is made to the description above.

A transistor cell 120 in semiconductor device 500 may include two trenches 130 disposed next to each other in lateral direction of the semiconductor body 101. An additional electrode 111 may be disposed in each of the two trenches 130. A gate electrode 109 may be disposed over a first side 106 of a semiconductor body 101 between the two trenches 130. The first side 106 may, for example, be a front side of the semiconductor body 101. The gate electrode 109 may be insulated from the semiconductor body 101 by first insulating layer 110. The additional electrodes 111 may be surrounded by respective second insulating layers 112. P-doped body regions 108 may be formed in the semiconductor body 101 on either side of the gate electrode 109 and may be partially overlapped by the gate electrode 109. N-doped (e.g. highly n-doped, e.g. n+ doped) first terminal electrode regions 102 may be formed in the body regions 108 between the gate electrode 109 and a respective trench 130.

The first terminal electrode regions 102 may be connected to a first terminal electrode 104, which may be disposed over the first side 106 of the semiconductor body 101. P-doped (e.g. highly p-doped, e.g. p+ doped) regions 118 may be formed adjacent to the first terminal electrode regions 102 in the p-doped body regions 108 and may be connected to the first terminal electrode 104. The highly p-doped regions 118 may serve to electrically contact the body regions 108.

A second terminal electrode 105 may be disposed over a second side 107 of the semiconductor body 101, which may be opposite the first side 106. Second side 107 may, for example, be a back side of the semiconductor body 101. The second terminal electrode 105 may serve to contact a second terminal electrode region 103, which may include an n-doped (e.g. highly n-doped, e.g. n+ doped) first subregion 103a adjacent to the second terminal electrode 105 and an n-doped (e.g. lightly n-doped, e.g. n− doped) second subregion 103b adjacent to the first subregion 103a. The p-doped body regions 108 may be formed between the second terminal electrode region 103 (or the second subregion 103b of the second terminal electrode region 103) and the first terminal electrode regions 102. The gate electrode 109 may extend along a horizontal direction and may overlap parts of the body regions 108 and a part of the second terminal electrode region 103 (or of the second subregion 103b of the second terminal electrode region 103) between the body regions 108. The additional electrodes 111 may extend along the body regions 108 and along at least part of the second terminal electrode region 103 (e.g., at least part of the second subregion 103b of the second terminal electrode region 103, as shown). Thus, the additional electrodes 111 may be formed in the trenches 130 and may extend vertically into the semiconductor body 101 while the gate electrode 109 may be disposed over the semiconductor body 101.

Similarly as in semiconductor devices 100, 150, 200, 300, and 400, the additional electrodes 111 may shield the gate electrode 109 and may prevent large field strengths at the first insulating layer 110.

Gate electrodes and/or additional electrodes of semiconductor devices, such as gate electrodes 109 and/or additional electrodes 111 of semiconductor devices 100, 150, 200, 300, 400, and 500, may contain or consist of an electrically conductive material, for example polysilicon or a metal (or metal alloy), although other electrically conductive materials may be possible as well. Insulating layers insulating the gate electrodes 109 and/or additional electrodes 111, such as first insulating layer 110 and/or second insulating layer 112 of semiconductor devices 100, 150, 200, 300, 400, and 500, may contain or consist of an electrically insulating material, for example an oxide, although other electrically insulating materials may be possible as well. Terminal electrodes of semiconductor devices, such as first terminal electrode 104 and/or second terminal electrode 105 of semiconductor devices 100, 150, 200, 300, 400, and 500, may contain or consist of an electrically conductive material such as, for example a metal or metal alloy, although other electrically conductive materials may be possible as well.

Furthermore, it may be understood that the doping types of the individual doped regions may be reversed to obtain devices of opposite conductivity type, for example p-type field effect transistors instead of n-type field effect transistors, or vice versa.

Semiconductor devices such as devices 100, 150, 200, 300, 400, and 500 may have a stripe-like pattern or structure. For example, additional electrodes 111 and/or gate electrodes 109 of device cells 120 may have a stripe-like pattern, as shown in FIG. 1B. However, it may be understood that semiconductor devices or device cells 120 of semiconductor devices may have differently shaped patterns or structures. For example, device cells 120 of semiconductor devices may have an arbitrary shape in general, for example a polygonal shape (e.g. triangular, quadrilateral, rectangular, square, hexagonal, or the like), a round shape (e.g. circular, elliptic, or the like), or an irregular shape.

In the following, reference will mainly be made to semiconductor devices, e.g. trench transistors, having electrodes made of polysilicon (also referred to as poly electrodes, or, short, polys) in the trench or trenches. However, it is to be understood that the same or similar considerations may also hold true for devices with electrodes containing or consisting of other electrically conductive materials such as, e.g., metals or metal alloys. Furthermore, dielectric or insulating layers in the trench(es) will mainly be described as oxides or oxide layers, e.g. field oxide (FOX) or gate oxide (GOX). However, it is to be understood that the same or similar considerations may also hold true for other dielectric or insulating materials.

Furthermore, although second terminal electrode 105 is shown as being disposed over the second side 107 of the semiconductor body 101, it may be understood that second terminal electrode 105 may also be disposed over the first side 106 of semiconductor body 101 (not shown). In this case, first subregion 103a of second terminal electrode region 103 may, for example, be configured as a buried layer and second terminal electrode 105 disposed over the first side 106 may be electrically connected to the buried layer by means of a vertical contact (e.g. contact trench) extending from the first side 106 as far as to the buried layer.

Trench transistors such as e.g. transistors 100, 150, 200, 300, 400, and 500 may be implemented as dense trench transistors. In one or more embodiments, the term "dense trench transistor" may include or refer to trench transistors having a high or very high integration density, for example including a large number (e.g. thousands, tens of thousands, hundreds of thousands, or millions, or even more) of transistor cells 120. In one or more embodiments, the term "dense trench transistor" may include trench transistors having a mesa width of less than or equal to about 1.5 times a trench width. The term "mesa width" may, for example, include or refer to a width of a region between two trenches of two adjacent device cells (e.g. width $w_m$ in FIG. 1A). The term "trench width" may, for example, include or refer to a width of a trench, in which the at least one additional electrode may be disposed (e.g. width $w_t$ in FIG. 1B). In one or more embodiments, the term "dense trench transistor" may include trench transistors having a mesa width of less than or equal to about 1.0 times the trench width. In one or more embodiments, the term "dense trench transistor" may include trench transistors, in which an electrical breakdown occurs at the trench bottom (in other words, in a region at or close to the bottom of the trench(es)).

Trench transistors may sometimes be operated in a so-called avalanche pulse mode. Dense trench transistors may incorporate hot charge carriers into the field dielectric (e.g. field oxide (FOX)), i.e. a dielectric layer (e.g. oxide layer) insulating a field plate of the transistor (e.g. second insulating layer 112 in semiconductor devices 100, 150, 200, 300, 400, and 500), (and/or into the gate dielectric (e.g. gate oxide (GOX)), i.e. a dielectric layer (e.g. oxide layer) insulating a gate electrode of the transistor (e.g. first insulating layer 110 in semiconductor devices 100, 150, 200, 300, 400) during each avalanche pulse. This may lead to undesired drifting of device parameters, for example breakdown voltage and/or starting voltage of the transistor, during repeated avalanche pulses (also referred to as repetitive avalanche applications). In principle, this drifting may also cause filamentation effects (wherein a transistor current may be concentrated on only one or a few cells having a lower breakdown voltage than the remaining cells), which may lead to premature destruction of the devices, which is illustrated in FIG. 6A.

Figure 6A:
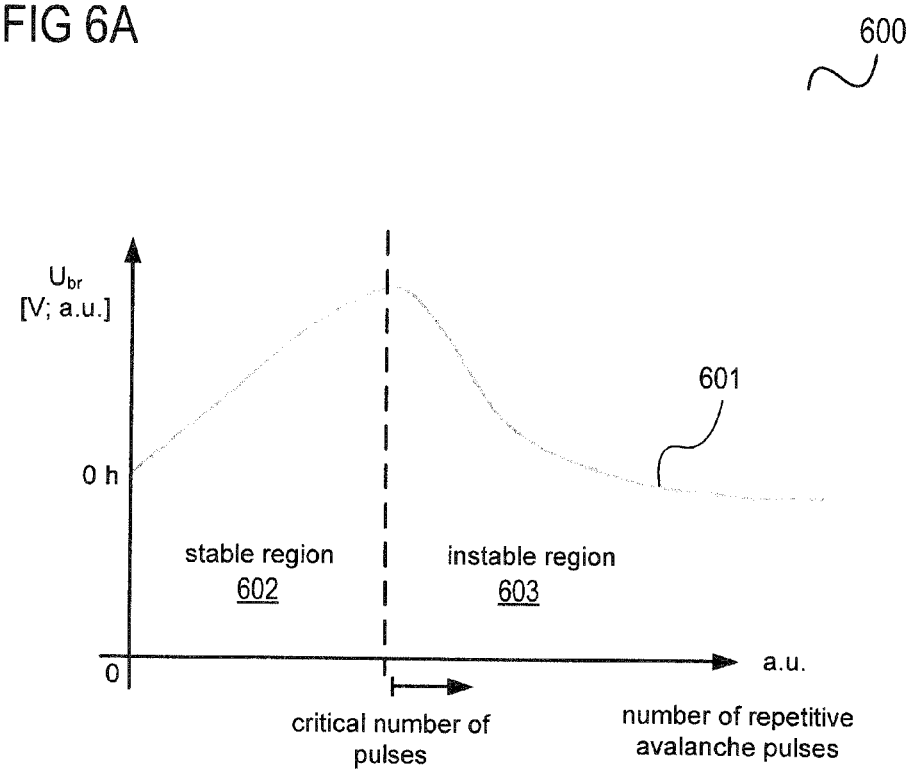
FIG. 6A shows a diagram illustrating a dependence of a trench transistor's breakdown voltage on a number of repetitive avalanche pulses.

FIG. 6A shows a diagram 600 plotting a trench transistor's breakdown voltage Ubr versus a number of repetitive avalanche pulses, as a curve 601.

It is shown that the breakdown voltage 601, starting from a so-called "zero hour" value, may initially rise (or drift) by a few volts with increasing number of avalanche pulses (see region 602). Region 602 may be seen as a stable operating region of the transistor. Then, after a critical number of avalanche pulses, the drifting direction of the breakdown voltage 601 may be reversed and the breakdown voltage 601 may decrease noticeably (see region 603). Region 603 may be seen as an operating region of the transistor, which may be unstable in principle. For a failure-free operation, it may be desirable that a transistor never reaches the falling region of the breakdown voltage 601 (region 603).

Figure 6B:
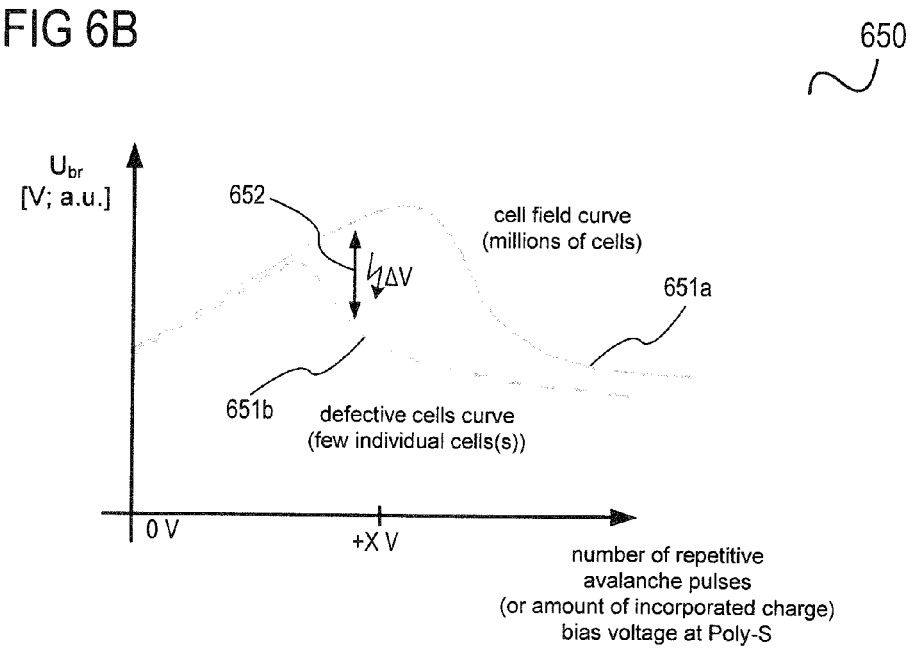
FIG. 6B shows a diagram illustrating a dependence of a breakdown voltage for non-defective transistor cells and defective transistor cells.

Another problem may occur when one or more individual transistor cells reach the falling mode significantly earlier than others, e.g. due to local faulty processing (defect density in e.g. trench or contact hole photo technique levels), as these (defective) cells may form local filaments, which may render the whole transistor unusable, which is illustrated in FIG. 6B.

FIG. 6B shows a diagram 650 plotting a breakdown voltage Ubr versus a number of repetitive avalanche pulses for two different types of transistor cells: a first curve 651a shows the breakdown voltage of normal (non-defective) cells (e.g. of a cell field including a large number (e.g. millions) of normal (non-defective) cells), while a second curve 651b shows the breakdown voltage of one or more (e.g. a few) defective transistor cells.

The term "defective cell" as used herein may, for example, include or refer to a cell that contains at least one defect or cell defect, for example a trench defect or contact trench defect. The term "non-defective cell" as used herein may, for example, include or refer to a cell that is free of defects.

The term "defect" as used herein may, for example, include or refer to a substantial deviation from a normal (or standard, or desired, or pre-determined) condition, state, shape and/or structure of a certain entity (e.g. element, structure, layer, etc.). For example, the term "trench defect" may include or refer to a substantial deviation of the shape or structure of a trench, or of one or more elements of the trench or in the trench, e.g. an electrode or dielectric in the trench. For example, the term "trench defect" may include a case, where a dimension (e.g. depth) of a trench substantially deviates from a desired dimension (e.g. depth), e.g. a trench depth that is too deep. Further, the term "trench defect" may include a case where a dimension of an element in a trench (e.g. a thickness of an insulating layer, e.g. gate dielectric (e.g. GOX), or field plate dielectric (e.g. FOX)) substantially deviates from a desired dimension (e.g. desired thickness), e.g. an oxide thickness that is too thin. Further, the term "trench defect" may include a case where an element in the trench, which was supposed to be present (e.g. an electrode, e.g. shield electrode, e.g. field plate), is actually missing, e.g. a missing poly electrode in the trench. Exemplary defects are also shown and described further below in connection with FIG. 9.

Defects as mentioned above may, for example, lead to a substantial deviation in the functionality, characteristics and/or behavior of the respective entity, compared with the functionality, characteristics or behavior of similar entities having no defects. For example, a defect in a transistor cell (e.g. trench defect, e.g. substantial thinning of a FOX) may lead to a substantial deviation in the transistor cell's behavior compared to other (non-defective) cells.

For example, as shown in FIG. 6B, the breakdown voltage 651b of defective transistor cell(s) may reach the falling region earlier (i.e. after a smaller number of avalanche pulses) than the breakdown voltage 651a of normal (non-defective) cell(s). This may lead to an increasing voltage difference $\Delta V$ (indicated by arrow 652) between the breakdown voltage of the defective cell(s) 651b and the breakdown voltage of the non-defective cells 651a. The higher this voltage difference 652 between the defective cell(s) and the remaining cell field becomes, the more critical the situation may become. Thus, if no further measures are taken, it may be possible that only relatively few avalanche pulses may be carried out with the transistor.

Therefore, it may be desirable to detect defective transistor cells during a pre-test of the transistor, for example in order to prevent defective devices from being delivered to customers.

Up to now, there are no reliable electrical detection methods to detect individual defective transistor cells, which may have formed as a result of trench defects or contact trench defects in trench transistors such as dual-poly trench transistors (i.e. trench transistors having two poly electrodes, namely a poly gate electrode (herein also referred to as Poly-G) and an additional poly electrode (herein also referred to as Poly-S) acting as a shield electrode and typically coupled with the transistor source during normal operation of the transistor, in order to filter out defective transistors. Structural inline detection methods may be very time-consuming and may show a reliable filtering only for defects of a certain minimum size, e.g. defects having a minimum size of at least 1 µm, for example significantly larger than 3 µm.

One or more embodiments may provide test methods and arrangements for testing semiconductor devices, in particular trench devices such as trench transistors (e.g. dense trench transistors, e.g. trench field effect transistors (FETs), e.g. trench MOSFETs, or trench insulated-gate bipolar transistors (IGBTs)) containing a plurality of device cells (e.g. transistor cells), to detect defective devices, for example devices having defects (e.g. trench defects) in one or more device cells. For example, trench transistors 100, 150, 200, 300, 400, and 500 described herein above may be seen as illustrative examples for semiconductor devices, to which test methods and/or test arrangements in accordance with one or more embodiments may be applied. However, as will be readily understood, test methods and/or test arrangements in accordance with one or more embodiments described herein may also apply to other trench devices, e.g. other trench transistors, for example trench transistors with three or more electrodes in one trench.

One or more embodiments may implement so-called defect density scans and/or reliability scans by providing corresponding test structures or arrangements and test methods, in which trench devices (such as trench transistors) having a plurality of electrodes (e.g. polysilicon electrodes (polys)), for example a gate electrode and one or more additional electrodes (e.g. a shield electrode, e.g. a field plate), in the trench may be electrically scanned for defects and/or quality of one or more trench dielectrics (e.g. oxides), for example the quality of a field oxide (FOX) and/or a gate oxide (GOX) and/or an inter-electrode oxide (e.g. oxide between two polys (POLOX)). Thus, in accordance with one or more embodiments, defective devices may be detected and filtered out at the end of the front end, e.g. on wafer level, so that it may, for example, be prevented that the defective products are delivered to a customer. In one or more embodiments, corresponding device (e.g. transistor) structures and/or pad structures and/or wiring structures and/or scan or test procedures may be provided, that may enable the aforementioned defect detection and/or filtering of defective devices or products.

One or more embodiments may provide structures or methods, which may allow for detecting and filtering out defective transistor cells, which may affect the breakdown voltage of the transistor. Thus, it may, for example, be possible to prevent defective devices from being delivered to customers.

Conventionally, dual-poly transistors may be internally connected in such a manner that the lower poly in the trench (field plate poly, or so-called "Poly-S"), e.g. electrode 111 in FIG. 1A, may be always at the source potential and may be, by means of the chip layout, directly connected with a power source metal pad via a contact hole.

In accordance with one or more embodiments, dual-poly transistors may be provided, in which the aforementioned field plate poly initially (e.g. up to and including front end measurements) may be led out separately to one or more pads that may be contacted separately. This may allow for general measurements or tests to be carried out in the front end (e.g. by means of probe cards, etc.), which may test the reliability of transistor cells and/or if or which transistor cells are affected by defects, before these separate pads may afterwards be connected with the source pad (or, more generally, with a pad that carries a desired or target potential) in the back end assembling.

In one or more embodiments, connecting the separate pad(s) to the source pad (or, the pad carrying the target potential) may be achieved in a simple manner e.g. by means of wire bonding and/or clip bonding, and/or anti-fuse techniques and/or metal rewiring or redistribution techniques using material deposition or laser cut, and/or other suitable techniques. For example, in case that the separate pad(s) is/are connected to the large source pad of a power transistor in the back end assembly, the final device or product may have the same potential characteristics and thus the same operating characteristics as a classical device or product.

One or more embodiments may include one or more of the following: a) disconnecting or undoing a direct contact of a poly electrode in a trench (e.g. Poly-S), b) providing a separate pad on a chip surface, c) forming a direct contact between the pad and the poly electrode in the trench, d) carrying out one or more defect scans and/or reliability tests e.g. in the front end (e.g. using one or more probes, e.g. a probe card), e) (optionally) evaluating data obtained by the test(s) by means of an evaluation scheme or algorithm such as dynamical PAT (part average testing) for filtering out systems that are defective or deviate from nominal values, f) (optionally) inking on wafer level and (optionally) delivering bare dies to customers, g) back end assembly, including formation of at least one conductive connection between the separate pad and a pad on the chip having a desired (target) potential (for example, connecting separate Poly-S pad with a power source pad on the chip for making contact to the source potential if the source potential is the desired potential, or (e.g. for high-speed or low-speed variants) connecting the separate Poly-S pad with a gate pad on the chip for making contact to the gate potential if the gate potential is the desired potential (in this case, the gate pad may, for example, be suitably enlarged), h) forming the aforementioned conductive connection (electrical contact) by means of bonding with one or more bond wires and/or a clip and/or anti-fuse techniques and/or metal rewiring or redistribution techniques using material deposition or laser cut and/or other suitable techniques, i) testing of the now restored normal transistor functions in the back end.

In one or more embodiments, a Poly-S voltage (in other words, a voltage applied to Poly-S electrodes) may be tuned during one or more low-current breakdown voltage measurements, such that various breakdown regimes may be tested (e.g. low-current parabola measurement). For example, the x-axis (i.e., axis pointing to the right) in diagram 650 of FIG. 6B may also represent the applied Poly-S bias voltage in a defect density scan, which (in the example shown in FIG. 6B) may detect a considerable deviation of the breakdown voltage Ubr from the nominal or desired value (represented by curve 651*a*) at a bias voltage of about +X volts (as shown) and may thus filter out the defective device. In other words, the occurrence of a deviation of the measured breakdown voltage from a nominal or desired breakdown voltage at a certain value (e.g. +X volts, as shown) of the Poly-S bias voltage may indicate that the tested device (or, one or more device cells) may include one or more defects.

In one or more embodiments, a FOX defect density stress test may be carried out, which may be similar to a GOX stress test. This may include gradually increasing a Poly-S potential with respect to all remaining potentials (e.g. potentials at source, drain and other gates of the transistor), which remain at ground (e.g. 0 V). For example, in accordance with one or more embodiments, a FOX defect density stress test may include applying a high potential to the Poly-S electrode, i.e. a potential which is high compared to the entire rest (which may be at ground, e.g. 0 V), in order to measure a tunnel current as a measure for a possibly defective thin part in the FOX, which may then be filtered out. In case of a particularly distinct thin part this may even lead to destruction of the FOX, so that the device (e.g. transistor) may then be filtered out with certainty. Alternatively, a voltage, which is negative compared to source, may be applied to the Poly-S electrode, and a positive voltage may simultaneously be applied to drain. Thus, in one or more embodiments, a trench bottom may be stressed more while a voltage may be reduced in a region of an oxide ramp, if necessary.

In one or more embodiments, a direct test of an inter-electrode dielectric (in other words, a dielectric layer between two electrodes in the trench), for example an oxide layer between two poly electrodes (herein also referred to as POLOX layer), may be carried out. For example, in accordance with some embodiments, Poly-G may be tested versus Poly-S. In other words, an inter-electrode dielectric between Poly-G and Poly-S may be tested for thin parts. The test procedure may be similar as in the FOX test, with the voltage being applied between the two electrodes (e.g. poly electrodes (polys), e.g. Poly-G and Poly-S) in the trench.

In one or more embodiments, two or three, or even more, electrodes (e.g. polys) in the trench may be tested in a similar manner as described above. In particular, an inter-electrode dielectric (e.g. inter-electrode oxide) between a respective electrode pair (e.g. poly pair) may be tested for thin parts.

In accordance with one or more embodiments, for example in case of high-speed or low-speed devices or products, electrodes (e.g. poly electrodes) in the trench, which may have the same potential in the final product, may be tested against each other.

In accordance with one or more embodiments, the test described herein may also be applied to sensor structures or devices.

In accordance with one or more embodiments, a Poly-S may (still) be separately bonded on product level. In this case, if a suitable Poly-S voltage is applied, pulsed high-current single or repetitive avalanche tests may be carried out, which may be very sensitive to defects, which may be, for example, not noticeable at all in conventional single avalanche tests (where Poly-S voltage=0 V). This may be a further way to filter or sort out defective devices or components by means of measurement. In the product, the required Poly-S potential or voltage may, for example, be applied in a circuitry-wise manner, or via fuses, zap diodes, or other suitable ways. This may also have the effect that devices or components may be analyzed with respect to their defect characteristics, after avalanche stress, annealing, or other stress tests.

An aspect of test arrangements and methods in accordance with one or more embodiments may be seen in that an arbitrary trench, which may carry an arbitrary electrical potential in the final product, may be tested for various reliability criteria (such as dielectric layer (e.g. oxide) thickness or breakdown voltage) in an intermediate stage. By using a suitable arrangement, also a semiconductor region between two or more selected trenches (e.g. a drift zone, an accumulation zone, etc.) may be tested in accordance with one or more embodiments. For example, a defect scan similar to a tomography of a human being may be possible by using separately controllable electrodes and varying various potentials (e.g. continuously) within predeterminable value ranges. Separate controlling of the electrode potentials may, for example, be achieved by providing one or more additional pads, which may be coupled to the respective electrodes.

In one or more embodiments, a shield electrode (e.g. field plate poly) may be not directly connected to a source pad via one or more contact holes, but at least one bond wire (or other connection structures) may be involved in establishing the electrical connection. For example, an electrode (e.g. poly), or also a semiconductor region, to be tested may be located structurally completely separate or isolated from the remaining chip construction and may be connected with the remaining chip construction by means of one or more electrical connections added afterwards (e.g. only after testing).

Figure 7A:
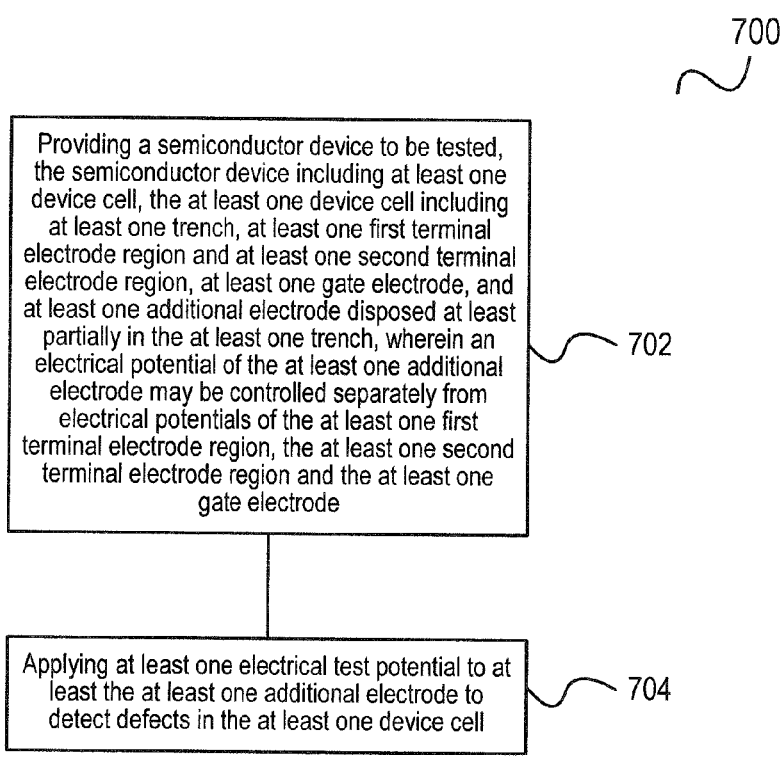
FIG. 7A shows a test method according to various embodiments.

FIG. 7A shows a test method 700 according to various embodiments.

In 702, a semiconductor device to be tested may be provided. The semiconductor device may include at least one device cell. The at least one device cell may include at least one trench, at least one first terminal electrode region and at least one second terminal electrode region, at least one gate electrode, and at least one additional electrode disposed at least partially in the at least one trench. An electrical potential of the at least one additional electrode may be controlled separately from electrical potentials of the at least one first terminal electrode region, the at least one second terminal electrode region and the at least one gate electrode. For example, the at least one additional electrode may be electrically disconnected or insulated from the at least one first terminal electrode region, the at least one second terminal electrode region and the at least one gate electrode.

In 704, at least one electrical test potential may be applied to at least the at least one additional electrode to detect defects in the at least one device cell.

In one or more embodiments, the semiconductor device may be formed in or may be part of a semiconductor workpiece, for example a wafer or a chip.

In one or more embodiments, the semiconductor workpiece may include at least one pad, for example a plurality of pads. In one or more embodiments, the semiconductor workpiece may include at least one first pad electrically connected to the at least one first terminal electrode region. In one or more embodiments, the semiconductor workpiece may include at least one second pad electrically connected to the at least one second terminal electrode region. In one or more embodiments, the semiconductor workpiece may include at least one third pad electrically connected to the at least one gate electrode. In one or more embodiments, the semiconductor workpiece may include at least one fourth pad electrically connected to the at least one additional electrode.

In one or more embodiments, the semiconductor workpiece may include at least one separate pad assigned to the at least one additional electrode. Thus, a potential of the at least one additional electrode may be controlled separately from potentials of other electrodes. In other words, the potential of the at least one additional electrode may be changed without changing potentials of other electrodes or electrode regions (e.g. gate electrode potential, and/or source/drain potential).

In one or more embodiments, the pads may be separate pads. In one or more embodiments, the pads may be electrically disconnected from one another.

In one or more embodiments, at least one of the pads may include or may consist of an electrically conductive material, for example a metal or metal alloy.

In one or more embodiments, at least one of the pads may be disposed at or over a front side of the semiconductor workpiece. In one or more embodiments, at least one of the pads may be disposed at or over a back side of the semiconductor workpiece.

In one or more embodiments, the semiconductor workpiece may include a semiconductor body, wherein the at least one trench may be formed in or extend into the semiconductor body.

In one or more embodiments, the semiconductor body may include or consist of silicon, although other semiconductor materials, including compound semiconductor materials, may be used in accordance with other embodiments.

In one or more embodiments, the at least one test potential may be configured to detect trench defects in the at least one device cell.

In one or more embodiments, the semiconductor device may include a plurality of device cells, for example hundreds of device cells, or thousands of device cells, or ten thousands of device cells, or hundreds of thousands of device cells, or millions of device cells, or even more device cells. In one or more embodiments, the device cells may be configured or arranged as a cell field.

In one or more embodiments, the plurality of device cells may all be configured substantially in the same way, for example may all have substantially the same structure, for example may all have substantially the same elements or regions.

In one or more embodiments, the at least one electrical potential may be applied to at least part of the cells simultaneously.

In one or more embodiments, the at least one electrical potential may be applied to all cells simultaneously.

In one or more embodiments, the at least one electrical potential may be applied to at least one common electrode connected to all cells.

In one or more embodiments, the at least one electrical test potential may be configured to detect defects in the plurality of device cells, for example trench defects and/or contact trench defects.

In one or more embodiments, the at least one electrical test potential may be configured to detect one or more defective device cells among the plurality of device cells of the semiconductor device.

In one or more embodiments, the first terminal electrode region may be configured to receive a first power supply potential during normal operation of the semiconductor device, for example a lower power supply potential or an upper power supply potential, e.g. a source/drain potential, e.g. a source potential, or an emitter/collector potential, e.g. an emitter potential.

In one or more embodiments, the second terminal electrode region may be configured to receive a second power supply potential during normal operation of the semiconductor device, for example an upper power supply potential or a lower power supply potential, e.g. a source/drain potential, e.g. a drain potential, or an emitter/collector potential, e.g. a collector potential.

In one or more embodiments, the semiconductor device may be configured as a transistor, for example as a field-effect transistor (FET), e.g. a MOSFET (e.g. NMOS or PMOS), or as a bipolar transistor, e.g. an insulated-gate bipolar transistor (IGBT).

In one or more embodiments, the at least one first terminal electrode region may include or be a first source/drain region, for example a source region or a drain region.

In one or more embodiments, the at least one second terminal electrode region may include or be a second source/drain region, for example a drain region or a source region.

In one or more embodiments, the at least one first terminal electrode region may include or be a first emitter/collector region, for example an emitter region or a collector region.

In one or more embodiments, the at least one second terminal electrode region may include or be a second emitter/collector region, for example a collector region or an emitter region.

In one or more embodiments, the transistor may be configured as a trench transistor.

In one or more embodiments, the transistor may be configured as a power transistor.

In one or more embodiments, the at least one gate electrode may be configured to control a switching state of the semiconductor device, e.g. a switching state of the transistor.

In one or more embodiments, the at least one gate electrode may be disposed at least partially in the at least one trench.

In one or more embodiments, the at least one gate electrode and the at least one additional electrode may be disposed at least partially in the at least one trench.

In one or more embodiments, the at least one gate electrode and the at least one additional electrode may be disposed in the same trench. In one or more embodiments, the at least one gate electrode may be disposed in an upper portion of the trench and the at least one additional electrode may be disposed in a lower portion of the trench below the at least one gate electrode. In one or more embodiments, the at least one gate electrode and the at least one additional electrode in the trench may be insulated from one another, for example by means of an insulating layer or inter-electrode dielectric, for example an oxide layer.

In one or more embodiments, the at least one gate electrode and the at least one additional electrode may be disposed laterally next to each other in the at least one trench. In one or more embodiments, the at least one additional electrode may extend deeper in the trench than the gate electrode.

In one or more embodiments, the at least one gate electrode and the at least one additional electrode may be disposed in different trenches.

In one or more embodiments, the at least one cell may include at least one first trench and at least one second trench, wherein the at least one additional electrode may be disposed in the at least one first trench and the at least one gate electrode may be disposed in the at least one second trench.

In one or more embodiments, the at least one gate electrode may be disposed over the semiconductor body, for example over a front side of the semiconductor body.

In one or more embodiments, the at least one gate electrode may be insulated from the semiconductor body. In one or more embodiments, the semiconductor device may include at least one first insulating layer to insulate the at least one gate electrode. In one or more embodiments, the at least one first insulating layer may at least partially surround the at least one gate electrode. In one or more embodiments, the at least one first insulating layer may include or consist of an oxide. In accordance with other embodiments, the at least one first insulating layer may contain or consist of other insulating materials.

In one or more embodiments, the at least one additional electrode may be configured as a shield electrode, for example as a field plate.

In one or more embodiments, the at least one additional electrode may be insulated from the semiconductor body and/or the gate electrode. In one or more embodiments, the semiconductor device may include at least one second insulating layer to insulate the at least one additional electrode. In one or more embodiments, the at least one second insulating layer may be disposed in the at least one trench. In one or more embodiments, the at least one second insulating layer may at least partially surround the at least one additional electrode. In one or more embodiments, the at least one second insulating layer may include or consist of an oxide. In accordance with other embodiments, the at least one second insulating layer may contain or consist of other insulating materials.

In one or more embodiments, the at least one gate electrode may include or may consist of an electrically conductive material, for example polysilicon or a metal or metal alloy, although electrically conductive materials may be used in accordance with other embodiments.

In one or more embodiments, the at least one additional electrode may include or may consist of an electrically conductive material, for example polysilicon or a metal or metal alloy, although electrically conductive materials may be used in accordance with other embodiments.

In one or more embodiments, the semiconductor device may include or be configured in accordance with one or more features described in connection with one or more of semiconductor devices 100, 150, 200, 300, 400, and 500.

In one or more embodiments, applying at least one test potential to at least the at least one additional electrode may include applying a plurality of test potentials to the at least one additional electrode, for example a sequence of increasing test potentials (in other words, a sequence of test potentials, each test potential having a fixed magnitude, and the magnitudes increasing from test potential to test potential, i.e. $V1<V2<V3<\ldots<Vn-1<Vn$, with Vi being the i-th potential of the sequence), or a sequence of decreasing test potentials (in other words, a sequence of test potentials, each test potential having a fixed magnitude, and the magnitudes decreasing from test potential to test potential, i.e. $V1>V2>V3>\ldots>Vn-1>Vn$, with Vi being the i-th potential of the sequence).

In one or more embodiments, applying at least one test potential to at least the at least one additional electrode may include applying a plurality of different test potentials to the at least one additional electrode while applying a fixed potential (for example, ground potential, e.g. 0 V) to the at least one gate electrode, the at least one first terminal electrode region and the at least one second terminal electrode region. For example, applying at least one test potential to at least the at least one additional electrode may include ramping up a potential at the at least one additional electrode while maintaining the potentials of the at least one first terminal electrode region, the at least one second terminal electrode region and the gate electrode at a fixed value, e.g. ground, e.g. 0 V.

In one or more embodiments, the method may include applying the at least one test potential to at least the at least one additional electrode and measuring a tunnel current through the at least one second insulating layer. In other words, the at least one test potential may be configured to measure a tunnel current through the at least one second insulating layer.

In one or more embodiments, the method may include applying the at least one test potential to at least the at least one additional electrode and determining a breakdown voltage of the semiconductor device. In other words, the at least one test potential may be configured to determine a breakdown voltage of the semiconductor device.

In one or more embodiments, applying the at least one test potential to at least the at least one additional electrode may include carrying out one or more breakdown voltage measurements, for example low-current breakdown voltage measurements, with varying bias voltages at the at least one additional electrode, e.g. a low-current parabola measurement. In one or more embodiments, the bias voltage may be varied (e.g. ramped) from a lower bias voltage to an upper bias voltage, which is higher than the lower bias voltage. In one or more embodiments, the lower bias voltage may be about −20 V and the upper bias voltage may be about +50 V. In one or more embodiments, the lower bias voltage may be about −5 V and the upper bias voltage may be about +25 V. In one or more embodiments, the lower bias voltage may be about 0 V and the upper bias voltage may be about +12 V.

In one or more embodiments, each breakdown voltage measurement (i.e., for each value of the bias voltage at the at least one additional electrode) may include ramping up a potential at the at least one second terminal electrode region (e.g. drain region) while applying a fixed potential (e.g. ground potential, e.g. 0 V) to the at least one gate electrode and the at least one first terminal electrode region (e.g. source region), and measuring an electric current flowing between the at least one first terminal electrode region (e.g. source region) and the at least one second terminal electrode region (e.g. drain region). The potential at the at least one second terminal electrode region (e.g. drain region) may, for example, be ramped up starting from a lower value $U_{lower}$ (e.g. 0 V) until a desired value of the electric current (e.g. 1 mA) is measured at some upper value $U_{upper}$ of the potential. The difference between the potential $U_{upper}$ at the at least one second terminal electrode region and the potential at the at least one first terminal electrode region (e.g. ground potential, e.g. 0 V) may then indicate the breakdown voltage Ubr corresponding to the respective bias voltage at the at least one additional electrode. By carrying out breakdown voltage measurements for a number of different bias voltages at the at least one additional electrode, the dependence of the breakdown voltage on the bias voltage may be determined, which may, for example, look similar to one of the curves shown in FIG. 6A and FIG. 6B.

In one or more embodiments, at least one of the at least one first terminal electrode region and the at least one second terminal electrode region may include or be configured as a contact trench region.

In one or more embodiments, the at least one test potential may be configured to detect one or more defects in the contact trench region or regions.

In one or more embodiments, applying the at least one test potential to at least the at least one additional electrode may include subjecting the semiconductor device to at least one of a defect density scan and a reliability scan.

In one or more embodiments, applying the at least one test potential to at least the at least one additional electrode may include subjecting the semiconductor device to a field oxide (FOX) stress test.

In one or more embodiments, applying at least one test potential to at least the at least one additional electrode may include forcing a predeterminable electrical current through the semiconductor device (e.g. transistor). The electrical current may have a constant or substantially constant current density. For example, the current density of the electrical current may be held constant or substantially constant for a predeterminable time period.

In one or more embodiments, the current density may be greater than or equal to about 0.5 A/mm$^2$ (amps per mm$^2$ of active device area), for example greater than or equal to about 10 A/mm$^2$, for example greater than or equal to about 50 A/mm$^2$, for example greater than or equal to about 100 A/mm$^2$ In one or more embodiments, the current density may be near a destruction limit of the device (e.g. transistor).

In one or more embodiments, applying at least one test potential to at least the at least one additional electrode may include carrying out an avalanche test.

In one or more embodiments, the avalanche test may include applying one or more avalanche pulses to the semiconductor device. In other words, the avalanche test may be a pulsed avalanche test.

In one or more embodiments, the method may further include analyzing test results obtained from testing the semiconductor device. In one or more embodiments, analyzing or evaluating the test results may include or be achieved by an evaluation scheme or algorithm such as dynamical part average testing (PAT).

In one or more embodiments, applying the at least one test potential to at least the at least one additional electrode may include or may be carried out using one or more probes, for example using a probe card including one or more probes. The probes may, for example, contact one or more contact pad(s) connected to the at least one first and second terminal electrode regions, the at least one gate electrode, and the at least one additional electrode.

In one or more embodiments, applying the at least one test potential to at least the at least one additional electrode may be carried out during or at the end of a front end processing stage.

In one or more embodiments, the at least one additional electrode may be electrically connected to the at least one first terminal electrode region (e.g. source region), or to the at least one gate electrode, after applying the at least one test potential, for example after carrying out one or more of the tests described herein. Connecting the at least one additional electrode to the at least one first terminal electrode region or to the at least one gate electrode may, for example, be achieved by forming an electrical connection between respective pads, e.g. between a pad coupled to the at least one additional electrode and a pad coupled to the at least one first terminal electrode region (e.g. source pad) or a pad coupled to the at least one gate electrode (gate pad).

In one or more embodiments, the semiconductor device may have a surface area (e.g. chip area) of greater than or equal to about 1 mm$^2$, for example greater than or equal to about 2 mm$^2$, for example greater than or equal to about 5 mm$^2$, for example greater than or equal to about 10 mm$^2$, for example greater than or equal to about 20 mm$^2$.

Figure 7B:
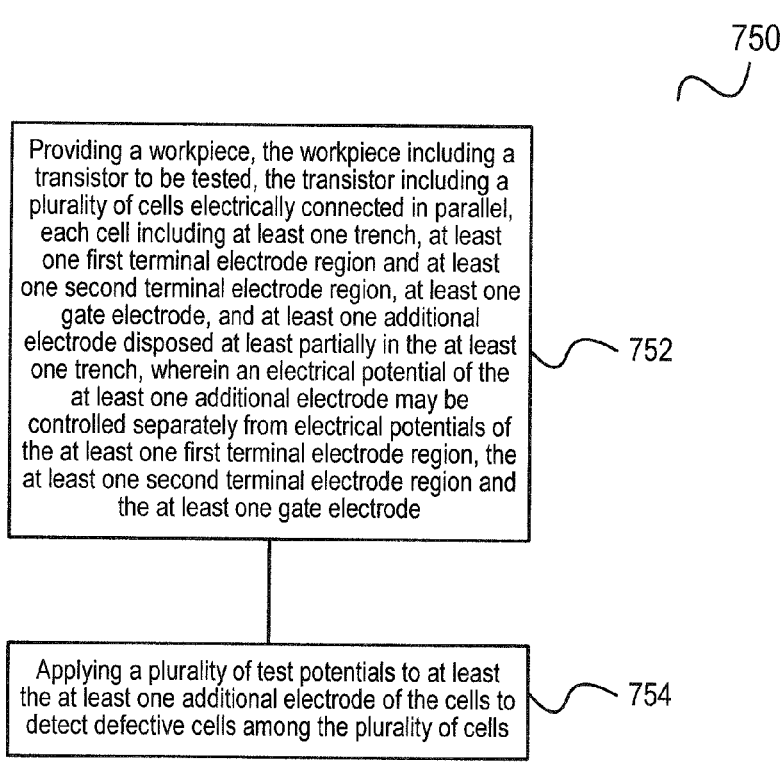
FIG. 7B shows a test method according to various embodiments.
Figure 12:
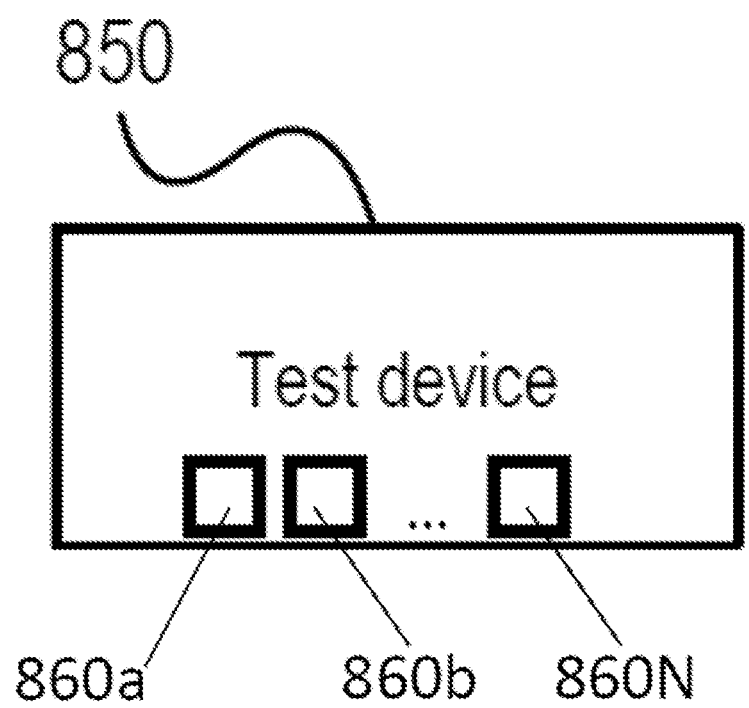
FIG. 12 shows a test device according to various embodiments.

FIG. 7B shows a test method 750 according to various embodiments.

In 752, a workpiece may be provided. The workpiece may include a transistor to be tested. The transistor may include a plurality of cells electrically connected in parallel. Each cell may include at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode.

In 754, a plurality of test potentials may be applied to at least the at least one additional electrode of the cells to detect defective cells among the plurality of cells.

Method 750 may further be configured in accordance with one or more embodiments described herein.

Test methods in accordance with one or more embodiments, for example method 700 and/or method 750, may, for example, be carried out by a test arrangement such as test arrangement 800' shown in FIG. 8.

FIG. 8 shows a test arrangement 800' in accordance with various embodiments.

Test arrangement 800' may include a semiconductor device 800 to be tested. Semiconductor device 800 may include at least one device cell 120. The at least one device cell 120 may include at least one trench 130. The at least one device cell 120 may further include at least one first terminal electrode region 102. The at least one device cell 120 may further include at least one second terminal electrode region 103. The at least one device cell 120 may further include at least one gate electrode 109. The at least one device cell 120 may further include at least one additional electrode 111. The at least one additional electrode 111 may be disposed at least partially in the at least one trench 130. An electrical potential of the at least one additional electrode 111 may be controlled separately from electrical potentials of the at least one first terminal electrode region 102, the at least one second terminal electrode region 103 and the at least one gate electrode 109.

Test arrangement 800' may further include a test device 850. Test device 850 may be configured to apply at least one electrical test potential to at least the at least one additional electrode 111 to detect defects in the at least one device cell 120.

In one or more embodiments, test device 850 may be electrically coupled or connected to semiconductor device 800, for example by means of one or more electrical connections 851, 852, 853, 854.

For example, test device 850 may be coupled to the at least one first terminal electrode region 102 via a first electrical connection 851. In one or more embodiments, first electrical connection 851 may, for example, include an electrical connection between test device 850 and a first pad 871 (e.g. first chip pad, e.g. a source pad) of semiconductor device 800 coupled to the at least one terminal electrode region 102 (or to a first terminal electrode coupled to the at least one terminal electrode region 102).

For example, test device 850 may be coupled to the at least one second terminal electrode region 103 via a second electrical connection 852. In one or more embodiments, second electrical connection 852 may, for example, include an electrical connection between test device 850 and a second pad 872 (e.g. second chip pad, e.g. drain pad) of semiconductor device 800 coupled to the at least one second terminal electrode region 102.

For example, test device 850 may be coupled to the at least one gate electrode 109 via a third electrical connection 853. In one or more embodiments, third electrical connection 853 may, for example, include an electrical connection between test device 850 and a third pad 873 (e.g. third chip pad, e.g. gate pad) of semiconductor device 800 coupled to the at least one gate electrode 109.

For example, test device 850 may be coupled to the at least one additional electrode 111 via a fourth electrical connection 854. In one or more embodiments, fourth electrical connection 854 may, for example, include an electrical connection between test device 850 and a fourth pad 874 (e.g. fourth chip pad) of semiconductor device 800 coupled to the at least one additional electrode 111.

In one or more embodiments, semiconductor device 800 may be formed in or be part of a chip or wafer. In one or more embodiments, at least one of the pads may be disposed over a front side of the chip or wafer. In one or more embodiments, at least one of the pads may be disposed over a back of the chip or wafer.

In one or more embodiments, semiconductor device 800 may be configured as a transistor, for example as a field effect transistor (FET), e.g. MOSFET, or as a bipolar transistor, e.g. an insulated-gate bipolar transistor (IGBT).

Semiconductor device 800, or one or more elements of semiconductor device 800 may, for example, be further configured in accordance with one or more embodiments described herein, for example in accordance with one more embodiments described in connection with method 700, and/or in accordance with one or more features described in connection with one or more of semiconductor devices 100, 150, 200, 300, 400, and 500.

In one or more embodiments, test device 850 may include or may be a test circuit. In one or more embodiments, test device 850 may include or may be test equipment. In one or more embodiments, test device 850 may include one or more probes (860a, 860b . . . 860N), for example a probe card including one or more probes. The probe(s) or probe card may, for example, serve to contact one or more pads electrically connected with one or more electrodes or electrode regions of semiconductor device 800, for example one or more of first to fourth pads described above.

In one or more embodiments, test device 850 may be configured to perform one or more tests or test methods in accordance with one or more embodiments described herein, for example a defect density scan and/or a reliability scan. To this end, test device 850 may be configured to apply one or more, e.g. a plurality of, test potentials to at least the at least one additional electrode 111. In one or more embodiments, test device 850 may, for example, be configured to apply a sequence of increasing or decreasing potentials to at least the at least one additional electrode 111. In one or more embodiments, test device 850 may, for example, be configured to force a predeterminable electric current through semiconductor device 800. In one or more embodiments, test device 850 may, for example, be configured to carry out an avalanche test, e.g. a pulsed avalanche test.

In one or more embodiments, test device 850 may be configured to evaluate test results obtained (e.g. measured breakdown voltages), for example by using an evaluation scheme or algorithm such as e.g. part average testing (PAT).

FIG. 9 shows a semiconductor device 900 having various cell defects, and further shows an electrical scan curve, for illustrating aspects of one or more embodiments.

Semiconductor device 900 may include a plurality of device cells 120. Each cell may include a trench 130. The trenches 130 may be formed within or extend into a semiconductor body 101. The trenches 130 may be configured to include a gate electrode 109 and an additional electrode 111 disposed in the respective trench 130. Gate electrode 109 may be insulated by a first insulating layer (e.g. gate oxide (GOX)), and additional electrode 111 may be insulated by a second insulating layer (e.g. field oxide (FOX)). Gate electrode 109 may serve to control a switching state of semiconductor device 900, while the additional electrode 111 may, for example, serve as a shield electrode to reduce an electric field intensity at the gate dielectric 110 insulating the gate electrode 109. A contact trench 115 may in each case be disposed between two neighboring trenches 130. Semiconductor device 900 may include further elements, for example first terminal electrode regions (e.g. source regions) disposed between the contact trenches 115 and the trenches 130, or at least one second terminal electrode region, and/or other elements (not shown for sake of clarity).

Three different cell defects 901, 902, 903 are shown as an example. A first cell defect may be a defect in a trench 130, namely that a thickness of the second insulating layer (e.g. FOX) insulating the additional electrode 111 substantially deviates from a desired thickness, in particular a considerable thinning of the second insulating layer (e.g. FOX) e.g. at the bottom of the trench 130, as indicated by encircled region 901. A second cell defect may be another defect of a trench 130, namely that the additional electrode 111 is missing in the trench 130, as indicated by encircled region 902. A third cell defect may be a defect of a contact trench 115, namely that a depth of the contact trench 115 is too deep, as illustrated by encircled region 903.

Cell defects 901, 902, and/or 903 may lead to a substantial deviation in the behavior of the corresponding cell or cells 120 compared to other (non-defective) cells 120, which may have a negative impact on the performance of semiconductor device 900, or may even render semiconductor device 900 unusable, as described above.

Test methods and/or test arrangements in accordance with one or more embodiments described herein may be able to detect defective cells having one or more cell defects, such as e.g. cell defects 901, 902, and/or 903 (or other defects), such that devices having defective cells may, for example, be filtered out.

In one or more embodiments, detection of defective cells may be carried out by applying one or more test potentials to the device cells 120, or to one or more electrodes or electrode regions of the cells 120, for example to carry out breakdown voltage measurements and/or dielectric layer stress tests, etc.

For example, in one or more embodiments, testing may include or be achieved by varying a bias potential at the at least one additional electrode 111 of semiconductor device 900 between a first value (e.g. 0 V) and a second value (e.g. some predeterminable upper limit), e.g. increasing the bias potential from the first value to the second value, and carrying out a low-current breakdown voltage measurement for each of the applied bias potentials. A deviation of the measured breakdown voltage from a nominal or desired value at some value of the bias potential may then, for example, indicate that semiconductor device 900 may have one or more defective cells.

For example, in accordance with one or more embodiments, an electrical scan curve may illustratively be pushed through the cell(s) 120 to detect anomalies (defects) 901, 902, 903 in semiconductor device 900, as illustrated in FIG. 9.

FIG. 9 shows (in the left half of the figure) the electrical push-through (indicated by arrows 920) of the scan curve for the case of additional electrode(s) 111 (e.g. Poly-S electrode(s)) being at a first bias potential, e.g. 0 V, (represented by first potential curve 910a in the trench bottom area) and the case of electrode(s) 111 being at a second bias potential, e.g. +12 V, (represented by second potential curve 910b in the inter-electrode dielectric layer (e.g. POLOX) area). Illustratively, curves 910a and 910b may represent electrical potential lines in semiconductor device 900 for two different values of the bias potential at the electrode(s) 111 (i.e., 0 V and +12 V) and a given value of the potential at the first terminal electrode regions (e.g. 0 V) and a given value of the potential at the second terminal electrode region (e.g. +30 V or +40 V). The electrical scan curve may be pushed from bottom to top into the cell(s) 120 according to the bias voltage applied to additional electrode(s) 111 (e.g. Poly-S electrode(s)). Anomalies (defects) 901, 902, 903 in the various cells 120 of semiconductor device 900 may be detected at low current densities as they may cause a different shape of the potential curve and thus a different value of the breakdown voltage Ubr. In one or more embodiments, a dynamical PAT evaluation algorithm may be applied to the Ubr distribution and may filter out anomalous (defective) devices (e.g. chips).

FIG. 10 shows a cross-sectional view of another exemplary semiconductor device 1000 for use with one or more embodiments.

Semiconductor device 1000 may be to some degree similar to semiconductor device 100 described above. In particular, reference numerals which are the same as there may denote the same or similar elements, which will thus not be described in detail again here.

Semiconductor device 1000 differs from semiconductor device 100 in that semiconductor device 1000 is configured as a diode. First terminal electrode regions 102 may be of the same conductivity type as body regions 108 and may be of the opposite conductivity type as second terminal electrode region 103. For example, first terminal electrode regions 102 may be p-doped (e.g. p+ doped) while second terminal electrode region 103 may be n-doped, including for example highly n-doped (e.g. n+ doped) first subregion 103a and lightly n-doped (e.g. n− doped) second subregion 103b. It may be understood that the conductivity type of all doped regions may be reversed. First terminal electrode regions 102 may be anode regions and first terminal electrode 104 may be an anode of the diode, while second terminal electrode region 103 may be a cathode region and second terminal electrode 105 may be a cathode of the diode, or vice versa.

Each device cell 120 of semiconductor device 1000 may include at least one trench 130. An electrode 1011 may be disposed in the trench 130 and may be electrically insulated from the semiconductor body 101 by means of an electrically insulating layer 1012 that may surround the electrode 1011. The electrodes 1011 may extend along body regions 108 and along at least part of the second terminal electrode region 103 (e.g., at least part of the second subregion 103b of the second terminal electrode region 103, as shown). The electrodes 1011 may be electrically connected to one another. The electrodes 1011 may contain or consist of an electrically conductive material such as, for example, polysilicon or a metal or metal alloy, but other electrically conductive materials may be used as well. The electrically insulating layer 1012 may contain or consist of an electrically insulating material such as, for example, an oxide, but other electrically insulating materials may be used as well.

FIG. 11 shows a test method 1100 according to various embodiments.

In 1102, a semiconductor device to be tested may be provided. The semiconductor device may be configured as a diode. The semiconductor device may include at least one device cell. The at least one device cell may include at least one trench, at least one first terminal electrode region and at least one second terminal electrode region, and at least one electrode disposed at least partially in the at least one trench. An electrical potential of the at least one electrode may be controlled separately from electrical potentials of the at least one first terminal electrode region and the at least one second terminal electrode region. For example, the at least one electrode may be electrically disconnected or insulated from the at least one first terminal electrode region and the at least one second terminal electrode region.

In 1104, at least one electrical test potential may be applied to at least the at least one electrode to detect defects in the at least one device cell.

In one or more embodiments, the semiconductor device may further include or be configured in accordance with one or more features described herein above in connection with semiconductor device 1000.

In one or more embodiments, the semiconductor device configured as a diode may be subjected to one or more of the test methods or tests described herein above to detect defects in the at least one device cell, for example a defect density scan, a reliability scan, an electrode insulating layer stress test, a breakdown voltage measurement, and/or an avalanche test, by applying at least one electrical test potential to at least the at least one electrode in a similar manner as described herein above. To this end, it may be provided that the at least one electrode disposed in the at least one trench may be electrically disconnected from the first and second terminal electrode regions and may, for example, be coupled to a separate pad, as described herein above. In one or more embodiments, the separate pad may later (e.g. after the test or tests have been carried out) be coupled to another pad carrying a desired potential during normal operation of the semiconductor device, as described herein above.

Illustratively, the semiconductor device configured as a diode and having at least one electrode disposed in a trench may be subjected to the same or similar tests as the semiconductor devices described herein having at least one gate electrode and having at least one additional electrode disposed in a trench. For example, a test arrangement in accordance with one or more embodiments, including the semiconductor device to be tested (i.e. the diode in this case) and the test device (e.g. test circuit or test equipment), may be configured in the same or a similar manner as the test arrangement 800' described herein above in connection with FIG. 8, except that the gate electrode 109 and consequently the electrical connection 853 are missing.

A test method in accordance with various embodiments may include: providing a semiconductor device to be tested, the semiconductor device including at least one device cell, the at least one device cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying at least one electrical test potential to at least the at least one additional electrode to detect defects in the at least one device cell.

In one or more embodiments, the semiconductor device may have a surface area (e.g. chip area) of greater than or equal to about 1 mm$^2$, for example greater than or equal to about 2 mm$^2$, for example greater than or equal to about 5 mm$^2$, for example greater than or equal to about 10 mm$^2$, for example greater than or equal to about 20 mm$^2$.

In one or more embodiments, the semiconductor device may be configured as a transistor.

In one or more embodiments, the at least one gate electrode may be disposed at least partially in the at least one trench.

In one or more embodiments, the at least one additional electrode may be configured as a shield electrode.

In one or more embodiments, the at least one test potential may be configured to detect one or more defects in the at least one trench.

In one or more embodiments, the at least one cell may include at least one contact trench, and the at least one test potential may be configured to detect one or more defects in the at least one contact trench.

In one or more embodiments, the at least one test potential may be configured to determine a breakdown voltage of the semiconductor device.

In one or more embodiments, applying at least one test potential to at least the at least one additional electrode may include forcing a predeterminable electrical current through the semiconductor device (e.g. transistor). The electrical current may have a constant or substantially constant current density. For example, the current density of the electrical current may be held constant or substantially constant for a predeterminable time period.

In one or more embodiments, the current density may be greater than or equal to about 0.5 A/mm$^2$ (amps per mm$^2$ of active device area, for example greater than or equal to about 10 A/mm$^2$, for example greater than or equal to about 50 A/mm$^2$, for example greater than or equal to about 100 A/mm$^2$ In one or more embodiments, the current density may be near a destruction limit of the device (e.g. transistor).

In one or more embodiments, applying at least one test potential to at least the at least one additional electrode may include carrying out an avalanche test.

In one or more embodiments, the avalanche test may include applying one or more avalanche pulses to the semiconductor device. In other words, the avalanche test may be a pulsed avalanche test.

In one or more embodiments, applying at least one test potential to at least the at least one additional electrode may include applying a plurality of test potentials to the at least one additional electrode, and the method may further include measuring a breakdown voltage of the semiconductor device for each of the plurality of test potentials.

In one or more embodiments, the at least one test potential may be configured to determine a strength of an insulating layer in the at least one trench.

In one or more embodiments, the at least one additional electrode may be insulated by an insulating layer disposed in the at least one trench, wherein applying at least one test potential to at least the at least one additional electrode may include applying a plurality of test potentials to the at least one additional electrode, and wherein the method may further include: measuring a tunnel current through the insulating layer for each of the plurality of test potentials.

In one or more embodiments, at least one of the at least one gate electrode and the at least one additional electrode may include polysilicon.

In one or more embodiments, the semiconductor device may include a plurality of device cells electrically connected in parallel, each device cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode, wherein the at least one test potential may be applied to all device cells of the plurality of device cells simultaneously.

In one or more embodiments, applying the at least one test potential may include subjecting the semiconductor device to at least one of a defect density scan and a reliability scan.

In one or more embodiments, the method may further include analyzing test results obtained by applying the at least one test potential, by means of dynamical part average testing (PAT).

In one or more embodiments, the semiconductor device may be formed in a semiconductor workpiece, the workpiece including a plurality of pads including at least a first pad coupled to the at least one first terminal electrode region, a second pad coupled to the at least one second terminal electrode region, a third pad coupled to the at least one gate electrode and a fourth pad coupled to the at least one additional electrode, wherein the fourth pad coupled to the at least one additional electrode may be electrically insulated from the first to third pads.

In one or more embodiments, the method may further include: electrically connecting the fourth pad to at least one of the first to third pads after applying the at least one test potential to at least the at least one additional electrode.

In one or more embodiments, electrically connecting the fourth pad to at least one of the first to third pads may be carried out in a back end processing stage of the semiconductor device.

In one or more embodiments, applying the at least one test potential to at least the at least one additional electrode may include using a plurality of probes.

In one or more embodiments, applying the at least one test potential to at least the at least one additional electrode may be carried out in a front end processing stage of the semiconductor device.

A test method in accordance with various embodiments may include: providing a workpiece, the workpiece including a transistor to be tested, the transistor including a plurality of cells electrically connected in parallel, each cell including at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and applying a plurality of test potentials to at least the at least one additional electrode of the cells to detect defective cells among the plurality of cells.

In one or more embodiments, applying the plurality of test potentials to at least the at least one additional electrode of the cells may include applying a plurality of different bias potentials to the at least one additional electrode, wherein the method may further include measuring a breakdown voltage of the transistor for each of the bias potentials.

In one or more embodiments, the at least one additional electrode may be insulated by an insulating layer disposed in the respective trench, wherein applying the plurality of test potentials to at least the at least one additional electrode may include applying a plurality of test potentials to the at least one additional electrode, and wherein the method may further include measuring a tunnel current through the insulating layer for each of the plurality of test potentials.

In one or more embodiments, the workpiece may further include a plurality of pads including at least a first pad coupled to the at least one first terminal electrode region, a second pad coupled to the at least one second terminal electrode region, a third pad coupled to the at least one gate electrode and a fourth pad coupled to the at least one additional electrode of each cell, wherein the fourth pad coupled to the at least one additional electrode may be electrically insulated from the first to third pads.

In one or more embodiments, applying the plurality of test potentials to at least the at least one additional electrode of the cells may be carried out in a front end processing stage of the workpiece; and the method may further include electrically connecting the fourth pad to at least one of the first to third pads in a back end processing stage of the workpiece.

A test arrangement in accordance with various embodiments may include: a semiconductor device to be tested, the semiconductor device including at least one device cell, the at least one device cell including at least one trench, at least one first terminal electrode region, at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode; and a test device configured to apply at least one electrical test potential to at least the at least one additional electrode to detect defects in the at least one device cell.

A test method in accordance with various embodiments may include: providing a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region; and applying at least one electrical test potential to at least the at least one electrode to detect defects in the at least one device cell.

A test arrangement in accordance with various embodiments may include: a semiconductor device to be tested, the semiconductor device being configured as a diode and including at least one device cell, the at least one device cell including at least one trench, at least one first terminal electrode region, at least one second terminal electrode region, and at least one electrode disposed at least partially in the at least one trench, wherein an electrical potential of the at least one electrode may be controlled separately from electrical potentials of the at least one first terminal electrode region and the at least one second terminal electrode region; and a test device configured to apply at least one electrical test potential to at least the at least one electrode to detect defects in the at least one device cell.

While various aspects of this disclosure have been particularly shown and described with reference to specific embodiments, it should be understood by those skilled in the art that various changes in form and detail may be made therein without departing from the spirit and scope of the disclosure as defined by the appended claims. The scope of the disclosure is thus indicated by the appended claims and all changes which come within the meaning and range of equivalency of the claims are therefore intended to be embraced.

What is claimed is:

1. A test method, comprising:
  providing a semiconductor device to be tested, the semiconductor device comprising at least one device cell, the at least one device cell comprising at least one trench, at least one first terminal electrode region and at least one second terminal electrode region, at least one gate electrode, and at least one additional electrode disposed at least partially in the at least one trench, wherein an electrical potential of the at least one additional electrode is separately controlled from electrical potentials of the at least one first terminal electrode region, the at least one second terminal electrode region and the at least one gate electrode; and
  applying at least one electrical test potential to at least the at least one additional electrode to detect defects in the at least one device cell,
  wherein a potential of the at least one additional electrode is electrically insulated from potentials of each of the at least one first terminal electrode region, the at least one second terminal electrode region, and the at least one gate electrode.

2. The method of claim 1,
wherein the semiconductor device is configured as a transistor.

3. The method of claim 1,
wherein the at least one gate electrode is disposed at least partially in the at least one trench.

4. The method of claim 1,
wherein the at least one additional electrode is configured as a shield electrode.

5. The method of claim 1,
wherein the at least one test potential is configured to detect one or more defects in the at least one trench.

6. The method of claim 1,
wherein the at least one cell comprises at least one contact trench, and wherein the at least one test potential is configured to detect one or more defects in the at least one contact trench.

7. The method of claim 1,
wherein the at least one test potential is configured to determine a breakdown voltage of the semiconductor device.

8. The method of claim 1,
wherein applying at least one test potential to at least the at least one additional electrode comprises forcing a predeterminable electrical current through the semiconductor device.

9. The method of claim 1,
wherein applying at least one test potential to at least the at least one additional electrode comprises applying a plurality of test potentials to the at least one additional electrode, and
wherein the method further comprises:
measuring a breakdown voltage of the semiconductor device for each of the plurality of test potentials.

10. The method of claim 1,
wherein the at least one test potential is configured to determine a strength of an insulating layer in the at least one trench.

11. The method of claim 1,
wherein the at least one additional electrode is insulated by an insulating layer disposed in the at least one trench,
wherein applying at least one test potential to at least the at least one additional electrode comprises applying a plurality of test potentials to the at least one additional electrode, and
wherein the method further comprises:
measuring a tunnel current through the insulating layer for each of the plurality of test potentials.

12. The method of claim 1,
wherein at least one of the at least one gate electrode and the at least one additional electrode comprises polysilicon.

13. The method of claim 1,
wherein the semiconductor device comprises a plurality of device cells electrically connected in parallel, each device cell comprising at least one trench, at least one first terminal electrode region and at least one second terminal electrode region, at least one gate electrode, and at least one additional electrode disposed at least partially in the at least one trench, wherein an electrical potential of the at least one additional electrode may be controlled separately from electrical potentials of the at least one first terminal electrode region, the at least one second terminal electrode region and the at least one gate electrode,
wherein the at least one test potential is applied to all device cells of the plurality of device cells simultaneously.

14. The method of claim 1,
wherein applying the at least one test potential to at least the at least one additional electrode comprises using a plurality of probes.

15. The method of claim 1,
wherein applying the at least one test potential to at least the at least one additional electrode is carried out in a front end processing stage of the semiconductor device.

16. A test arrangement, comprising:
a semiconductor device to be tested, the semiconductor device comprising at least one device cell, the at least one device cell comprising at least one trench, at least one first terminal electrode region, at least one second terminal electrode region, at least one gate electrode, and at least one additional electrode disposed at least partially in the at least one trench, wherein an electrical potential of the at least one additional electrode is controlled separately from electrical potentials of the at least one first terminal electrode region, the at least one second terminal electrode region and the at least one gate electrode; and
a test device configured to apply at least one electrical test potential to at least the at least one additional electrode to detect defects in the at least one device cell,
wherein a potential of the at least one additional electrode is electrically insulated from potentials of each of the at least one first terminal electrode region, the at least one second terminal electrode region, and the at least one gate electrode.

17. A test method, comprising:
providing a semiconductor device to be tested, the semiconductor device comprising at least one device cell, the at least one device cell comprising at least one trench, at least one first terminal electrode region and at least one second terminal electrode region, at least one gate electrode, and at least one additional electrode disposed at least partially in the at least one trench, wherein an electrical potential of the at least one additional electrode is separately controlled from electrical potentials of the at least one first terminal electrode region, the at least one second terminal electrode region and the at least one gate electrode; and
applying at least one electrical test potential to at least the at least one additional electrode to detect defects in the at least one device cell,
wherein applying at least one test potential to at least the at least one additional electrode comprises carrying out an avalanche test.

18. The method of claim 17,
wherein the avalanche test comprises applying one or more avalanche pulses to the semiconductor device.

19. A test method, comprising:
providing a semiconductor device to be tested, the semiconductor device comprising at least one device cell, the at least one device cell comprising at least one trench, at least one first terminal electrode region and at least one second terminal electrode region, at least one gate electrode, and at least one additional electrode disposed at least partially in the at least one trench, wherein an electrical potential of the at least one additional electrode is separately controlled from electrical potentials of the at least one first terminal electrode region, the at least one second terminal electrode region and the at least one gate electrode; and applying at least one electrical test potential to at least the at least one additional electrode to detect defects in the at least one device cell, wherein applying the at least one test potential comprises subjecting the semiconductor device to at least one of a defect density scan and a reliability scan.

20. A test method, comprising:

providing a semiconductor device to be tested, the semiconductor device comprising at least one device cell, the at least one device cell comprising at least one trench, at least one first terminal electrode region and at least one second terminal electrode region, at least one gate electrode, and at least one additional electrode disposed at least partially in the at least one trench, wherein an electrical potential of the at least one additional electrode is separately controlled from electrical potentials of the at least one first terminal electrode region, the at least one second terminal electrode region and the at least one gate electrode; and applying at least one electrical test potential to at least the at least one additional electrode to detect defects in the at least one device cell, and analyzing test results obtained by applying the at least one test potential, by means of dynamical part average testing (PAT).

21. A test method, comprising:

providing a semiconductor device to be tested, the semiconductor device comprising at least one device cell, the at least one device cell comprising at least one trench, at least one first terminal electrode region and at least one second terminal electrode region, at least one gate electrode, and at least one additional electrode disposed at least partially in the at least one trench, wherein an electrical potential of the at least one additional electrode is separately controlled from electrical potentials of the at least one first terminal electrode region, the at least one second terminal electrode region and the at least one gate electrode; and applying at least one electrical test potential to at least the at least one additional electrode to detect defects in the at least one device cell, wherein the semiconductor device is formed in a semiconductor workpiece, the workpiece comprising a plurality of pads including at least a first pad coupled to the at least one first terminal electrode region, a second pad coupled to the at least one second terminal electrode region, a third pad coupled to the at least one gate electrode and a fourth pad coupled to the at least one additional electrode, and wherein the fourth pad coupled to the at least one additional electrode is electrically insulated from the first to third pads.

22. The method of claim 21, further comprising:

electrically connecting the fourth pad to at least one of the first to third pads after applying the at least one test potential to at least the at least one additional electrode.

23. The method of claim 22, further comprising:

wherein electrically connecting the fourth pad to at least one of the first to third pads is carried out in a back end processing stage of the semiconductor device.

* * * * *